(12) United States Patent
Lee et al.

(10) Patent No.: US 12,507,592 B2
(45) Date of Patent: Dec. 23, 2025

(54) THERMOELECTRIC DEVICE

(71) Applicant: LG INNOTEK CO., LTD., Seoul (KR)

(72) Inventors: Jong Min Lee, Seoul (KR); Yong Sang Cho, Seoul (KR); Man Hue Choi, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 325 days.

(21) Appl. No.: 17/793,835

(22) PCT Filed: Oct. 25, 2021

(86) PCT No.: PCT/KR2021/015039
§ 371 (c)(1),
(2) Date: Jul. 19, 2022

(87) PCT Pub. No.: WO2022/092737
PCT Pub. Date: May 5, 2022

(65) Prior Publication Data
US 2023/0044428 A1 Feb. 9, 2023

(30) Foreign Application Priority Data
Oct. 26, 2020 (KR) .......................... 10-2020-0139322

(51) Int. Cl.
*H10N 10/17* (2023.01)
(52) U.S. Cl.
CPC .................................. *H10N 10/17* (2023.02)
(58) Field of Classification Search
CPC .............................. H10N 10/17; H10N 10/82
See application file for complete search history.

(56) References Cited

U.S. PATENT DOCUMENTS

2019/0051807 A1* 2/2019 Okumura ............. H10N 10/817
2021/0036204 A1* 2/2021 Gu ....................... H10N 10/817
(Continued)

FOREIGN PATENT DOCUMENTS

JP 2007-227508 9/2007
JP 2011-171567 9/2011
(Continued)

OTHER PUBLICATIONS

International Search Report dated Jan. 25, 2022 issued in Application No. PCT/KR2021/015039.
(Continued)

*Primary Examiner* — Lindsey A Buck
(74) *Attorney, Agent, or Firm* — KED & ASSOCIATES, LLP

(57) ABSTRACT

A thermoelectric device according to one embodiment of the present invention includes a substrate, a first insulating layer disposed on the substrate, a second insulating layer disposed on the first insulating layer and having an area smaller than an area of the first insulating layer, a plurality of first electrodes disposed on the second insulating layer, a plurality of semiconductor structures disposed on the plurality of first electrodes, and a plurality of second electrodes disposed on the plurality of semiconductor structures, wherein the second insulating layer includes an overlapping region in which the plurality of first electrodes, the plurality of second electrodes, and the plurality of semiconductor structures overlap vertically and a protruding pattern protruding from the overlapping region toward a first outer side the substrate.

12 Claims, 18 Drawing Sheets

(56) References Cited

U.S. PATENT DOCUMENTS

| | | | |
|---|---|---|---|
| 2021/0083165 A1* | 3/2021 | Jo ........................ | H10N 10/82 |
| 2021/0328123 A1* | 10/2021 | Park ..................... | H10N 10/17 |
| 2022/0085267 A1* | 3/2022 | Lee ...................... | H10N 10/81 |

FOREIGN PATENT DOCUMENTS

| | | | | |
|---|---|---|---|---|
| JP | 2020-155770 | | 9/2020 | |
| KR | 10-2019-0093516 | | 8/2019 | |
| KR | 10-2019-0116066 | | 10/2019 | |
| KR | 10-2020-0094388 | | 8/2020 | |
| KR | 10-2164983 | | 10/2020 | |
| WO | WO-2019146991 A1 | * | 8/2019 | ............ H01L 35/08 |
| WO | WO-2019151765 A1 | * | 8/2019 | ............ H01L 35/08 |
| WO | WO-2020153799 A1 | * | 7/2020 | ............ H01L 35/08 |
| WO | WO 2020/166647 | | 8/2020 | |

OTHER PUBLICATIONS

Japanese Office Action dated Jun. 10, 2025 issued in Application No. 2022-547139.

* cited by examiner

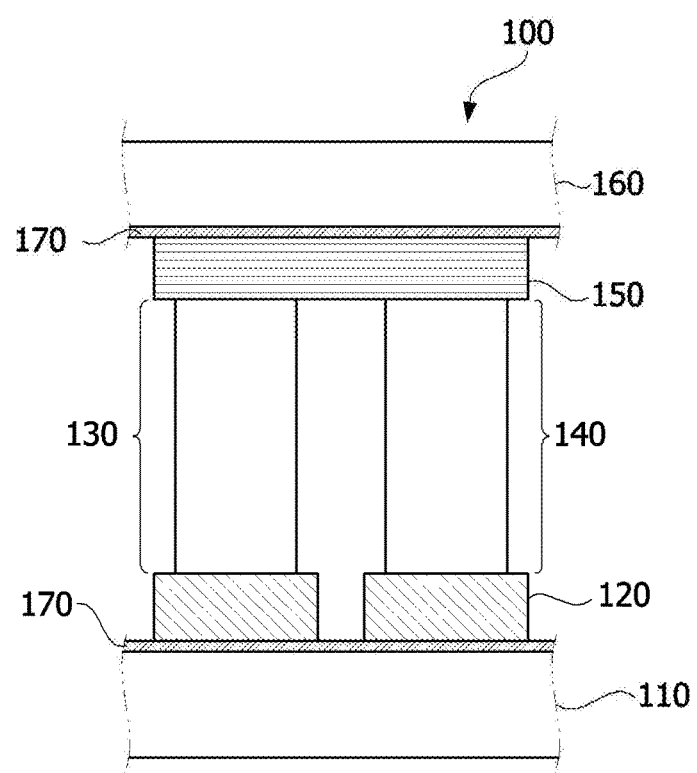
[FIG. 1]

[FIG. 2]
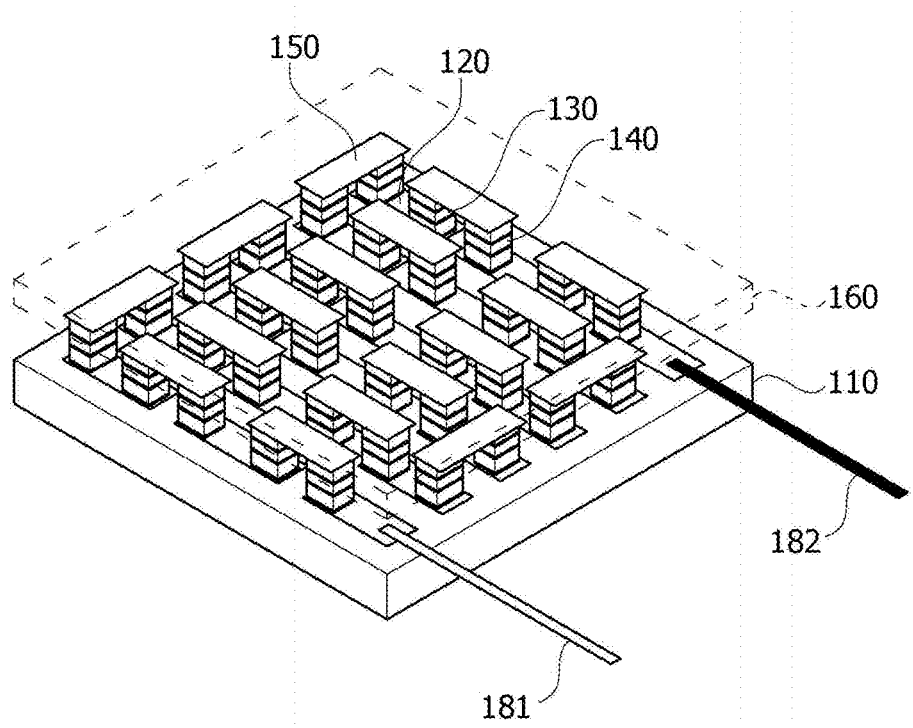

[FIG. 3]
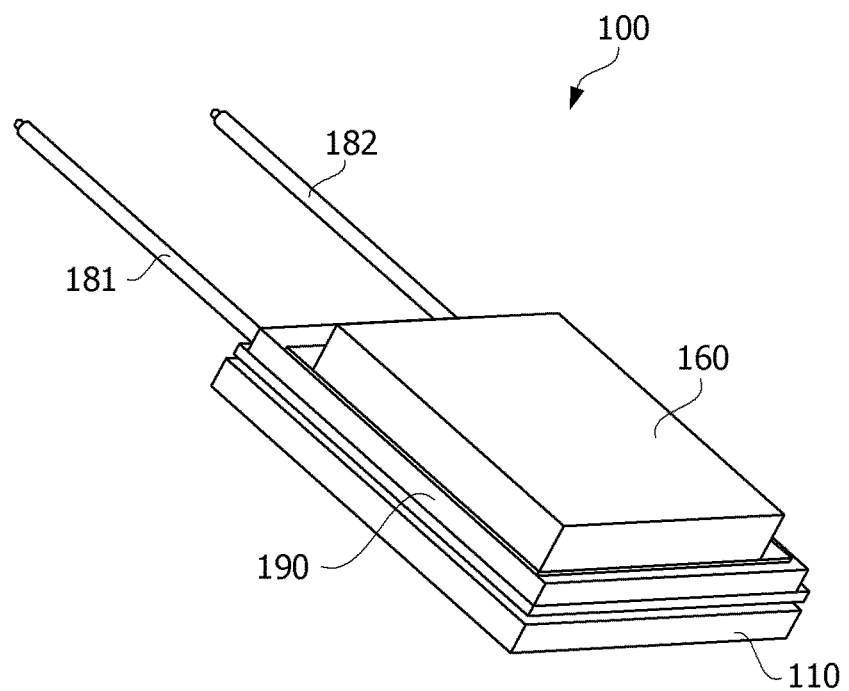

[FIG. 4]
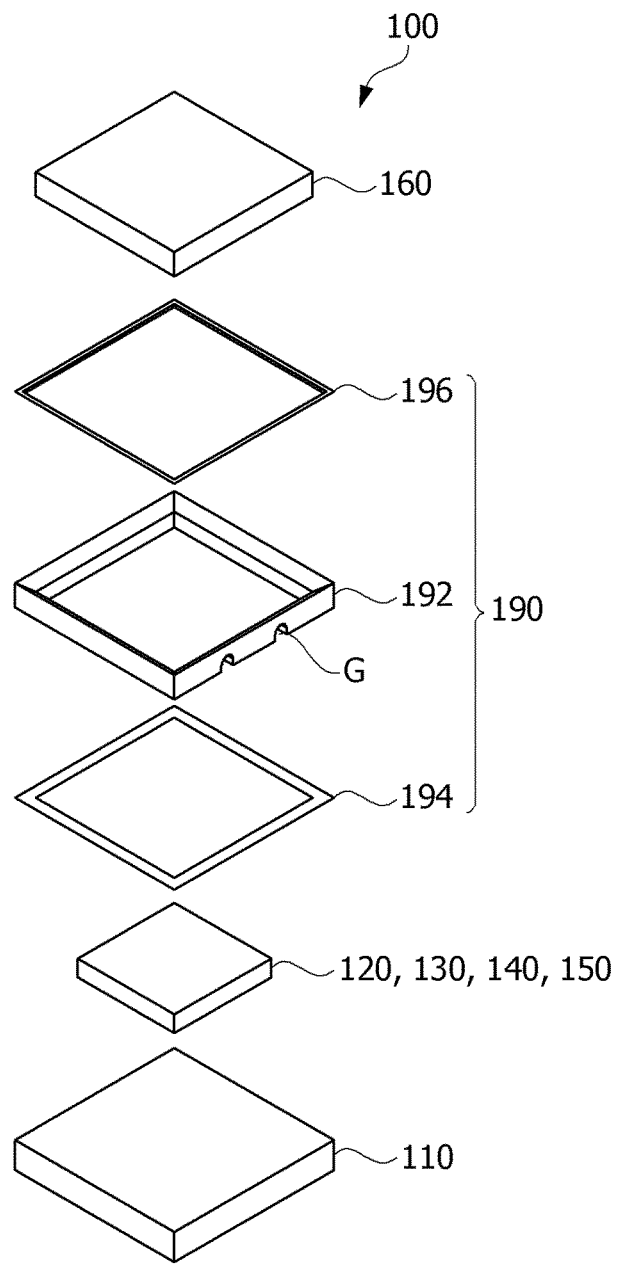

[FIG. 5]
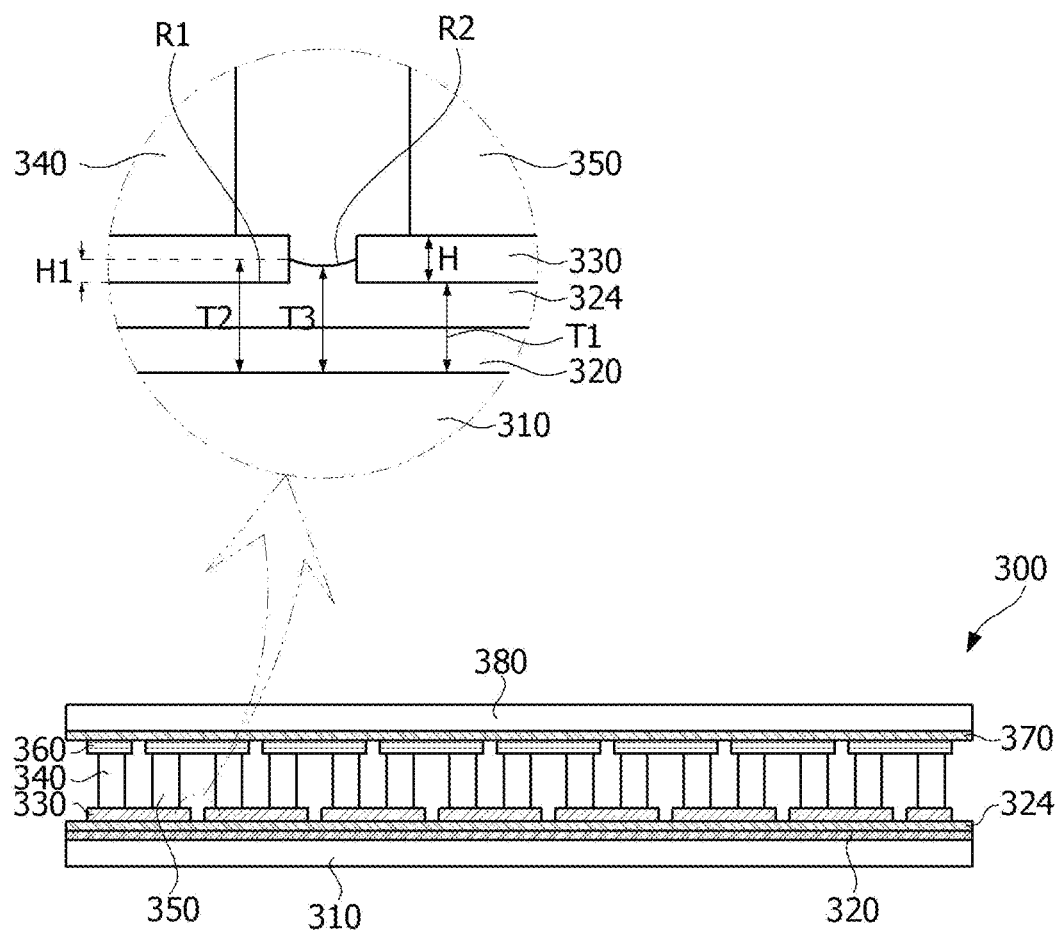

[FIG. 6]
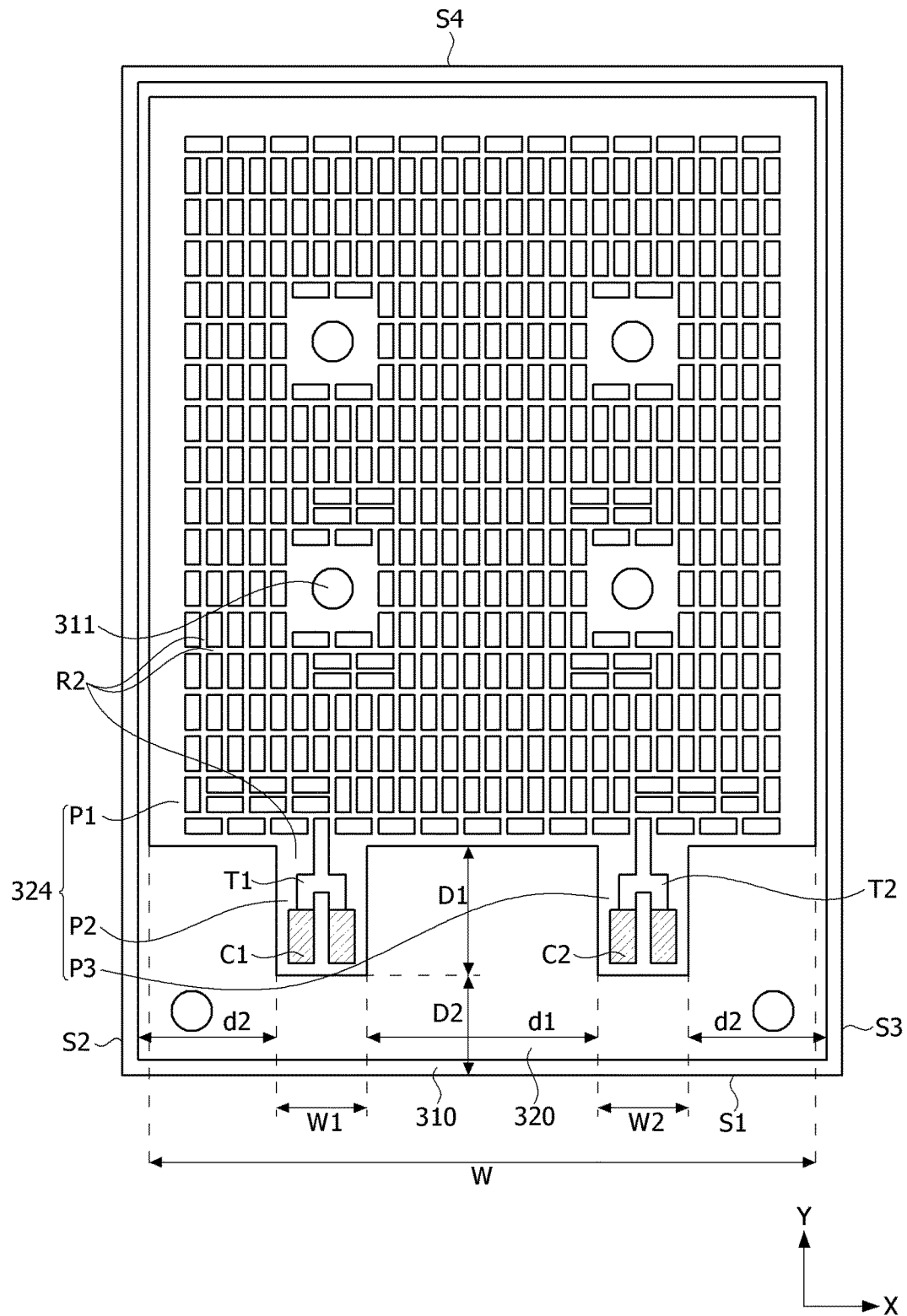

[FIG. 7A]
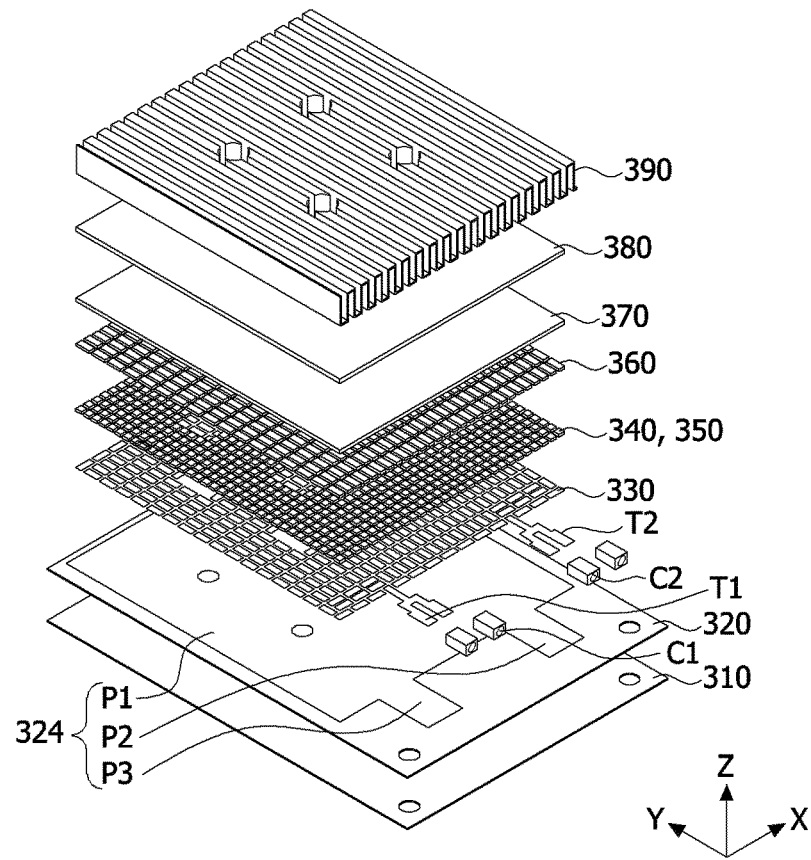
[FIG. 7B]
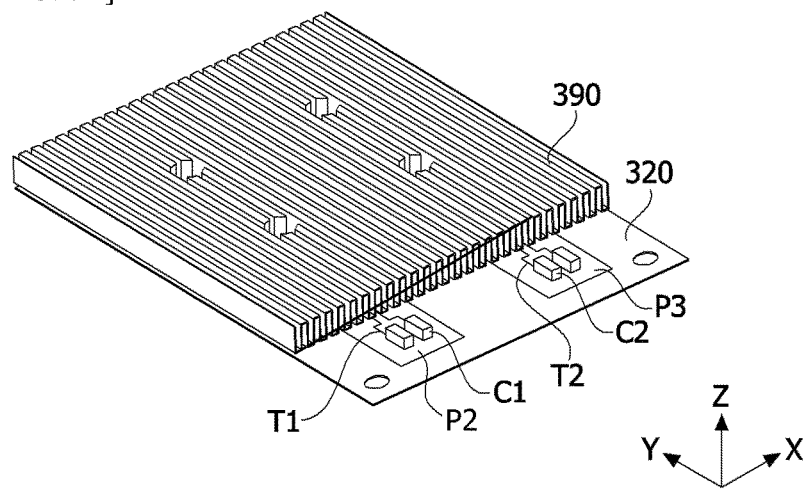

[FIG. 8]
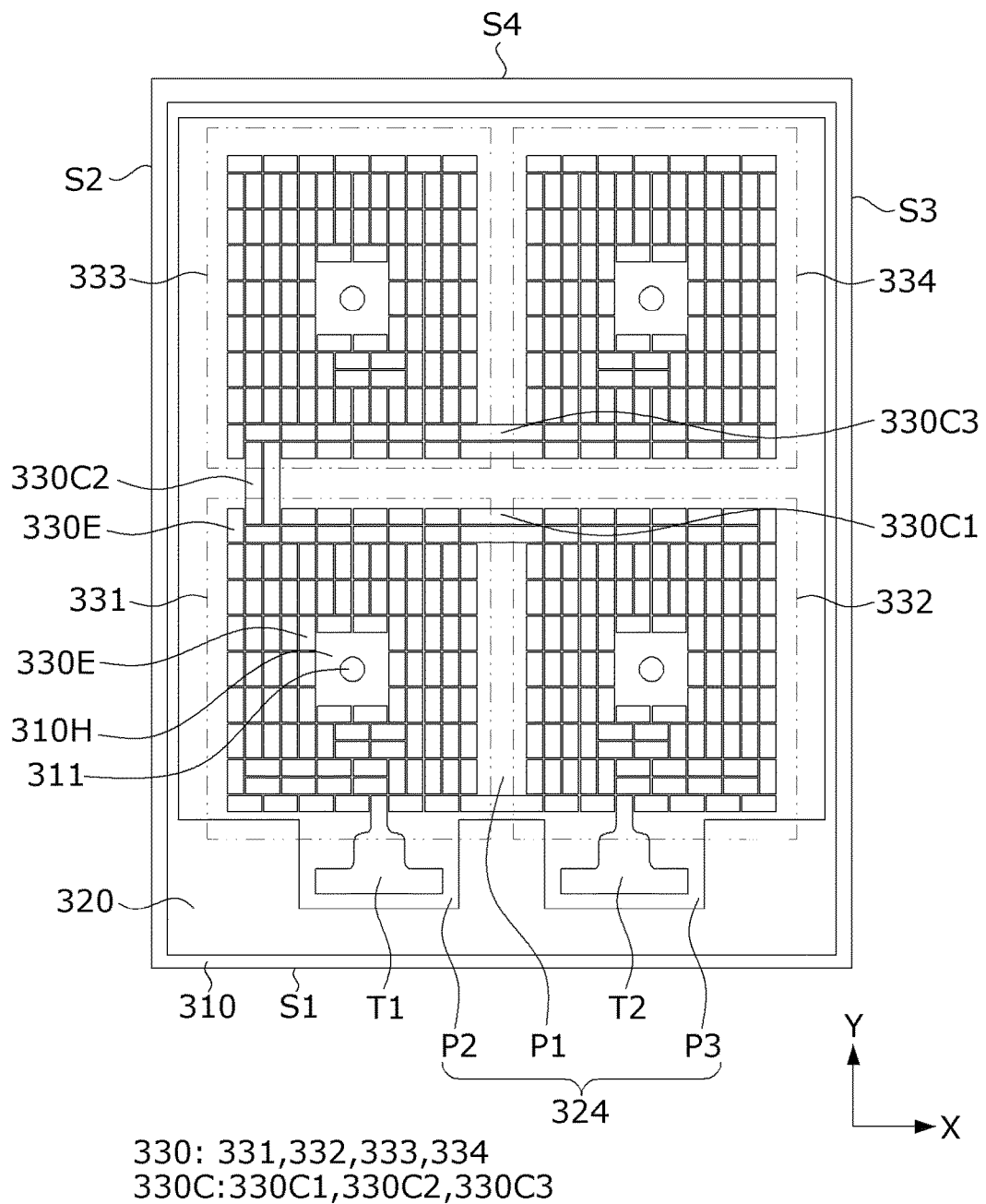
330: 331,332,333,334
330C:330C1,330C2,330C3

[FIG. 9]
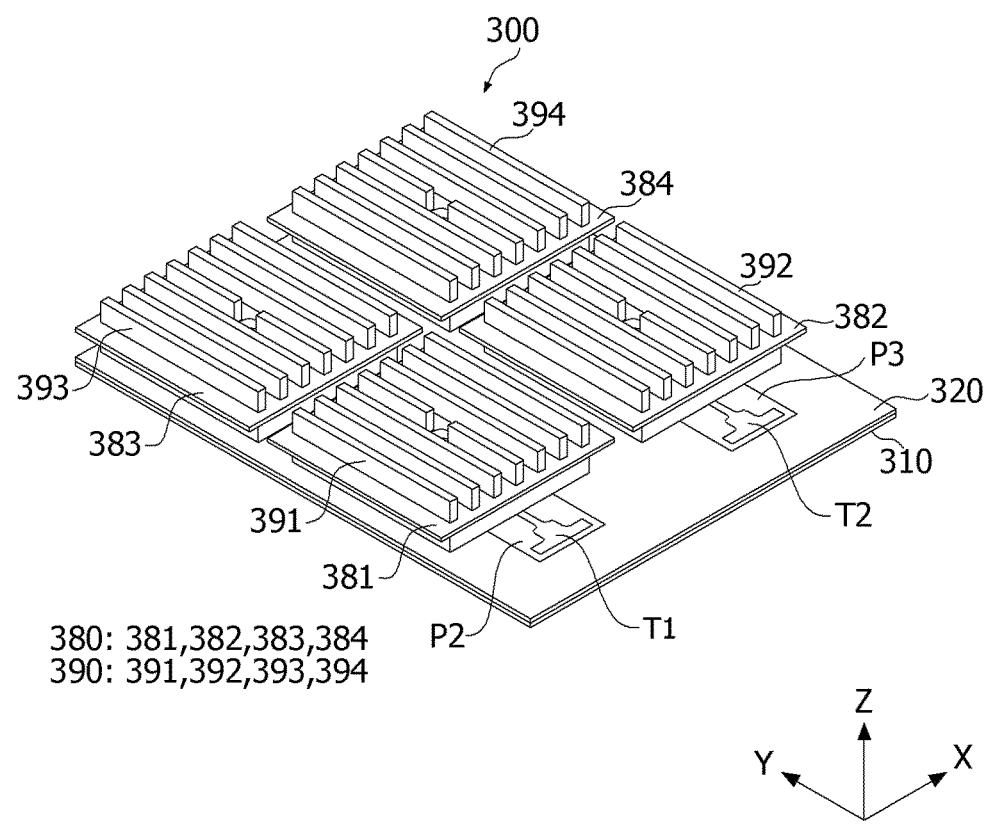

[FIG. 10]
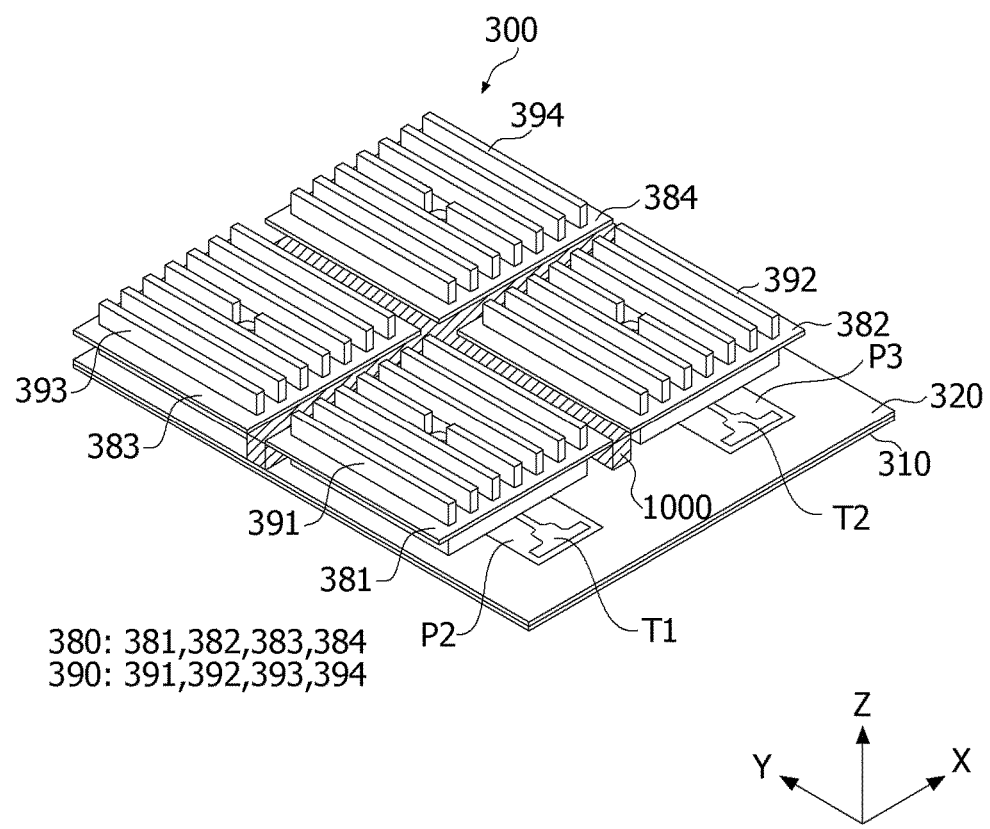

[FIG. 11]
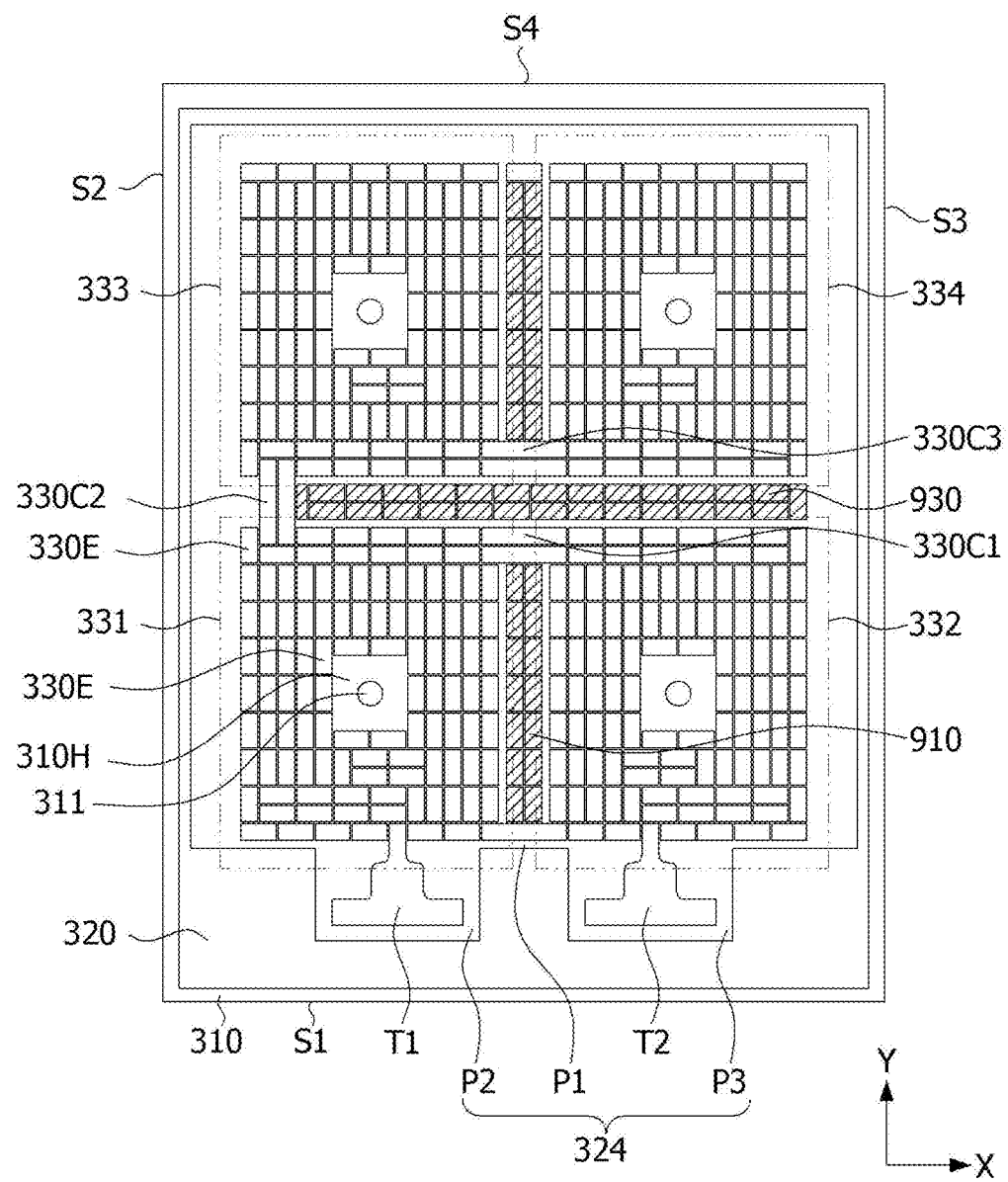
330: 331,332,333,334
330C: 330C1,330C2,330C3
900: 910,920,930

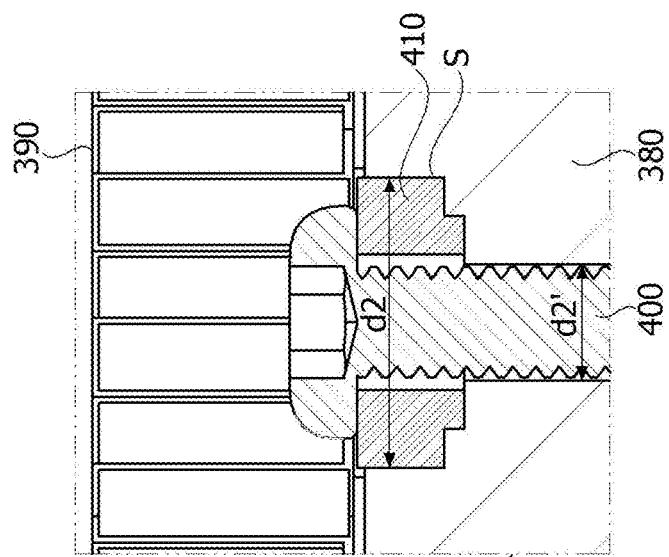
[FIG. 12B]
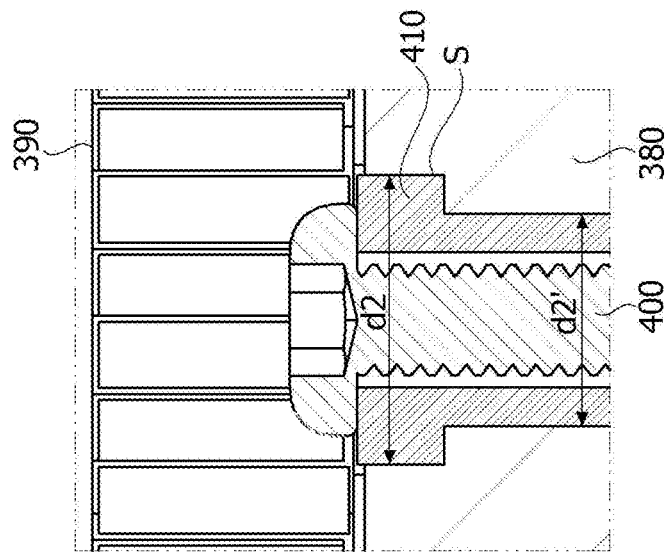
[FIG. 12A]
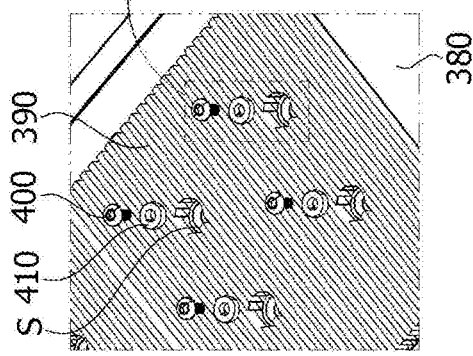

[FIG. 13A]
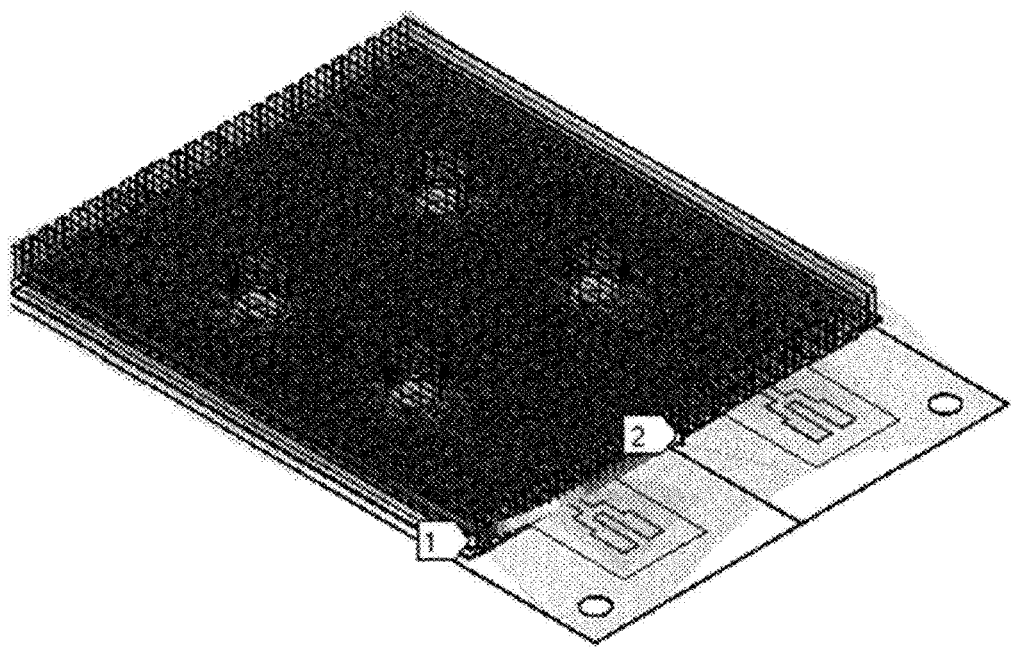
[FIG. 13B]
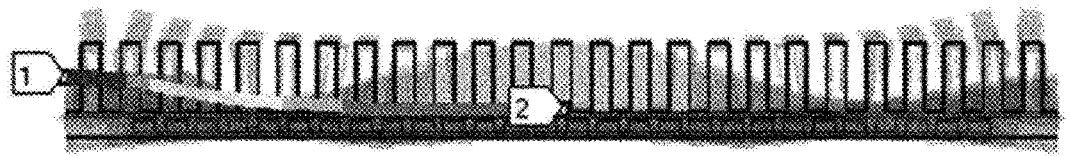

[FIG. 13C]
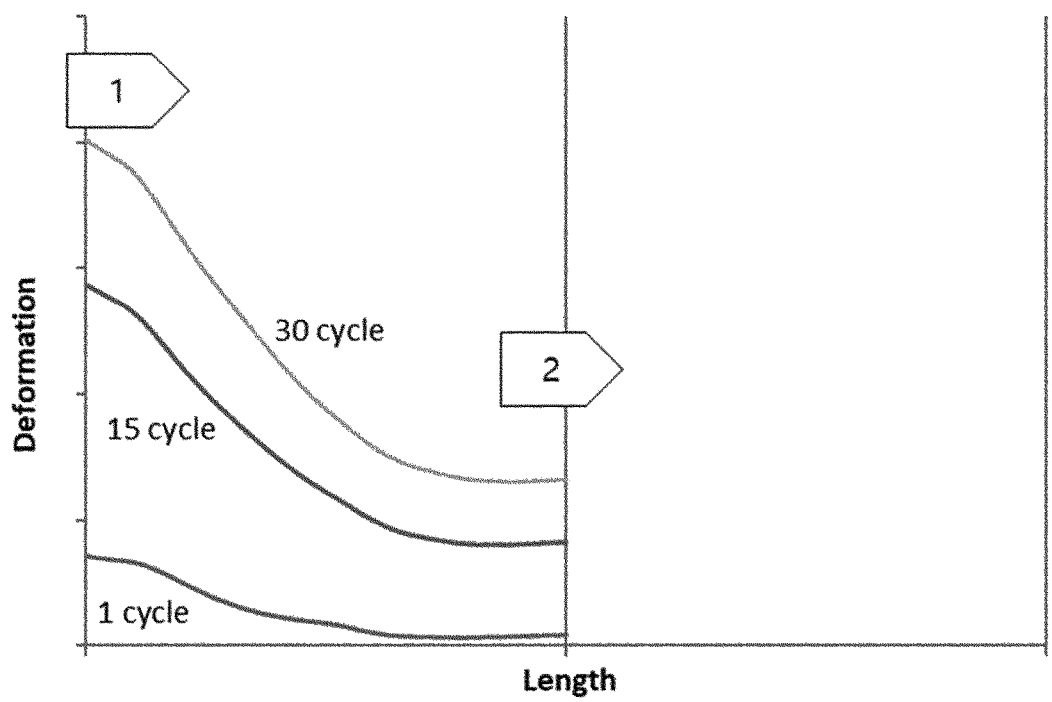

[FIG. 14A]
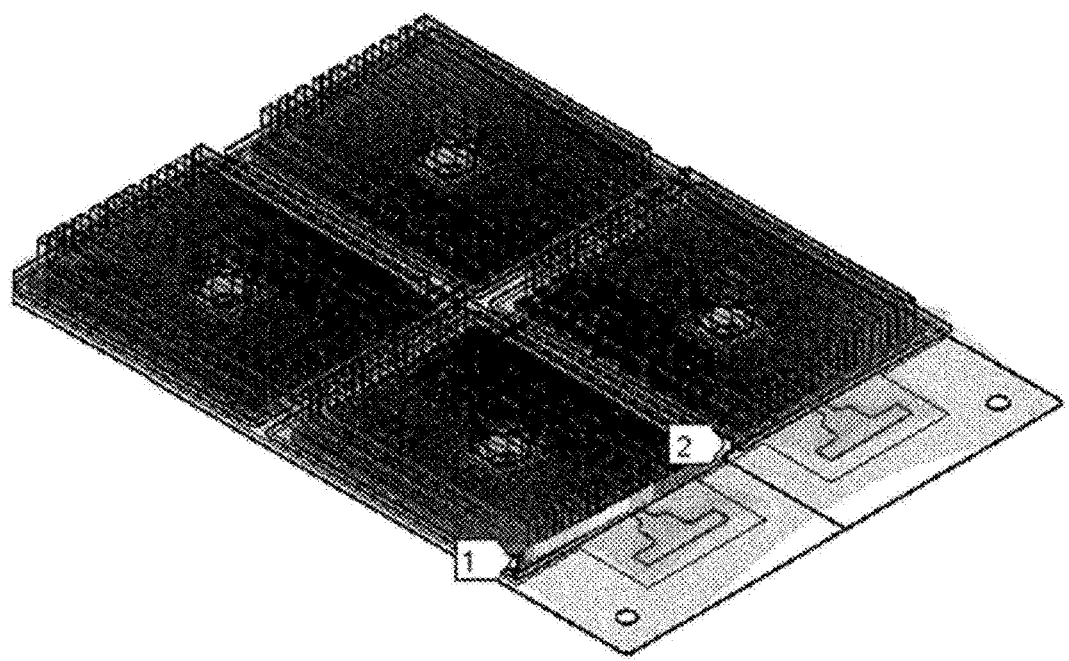
[FIG. 14B]
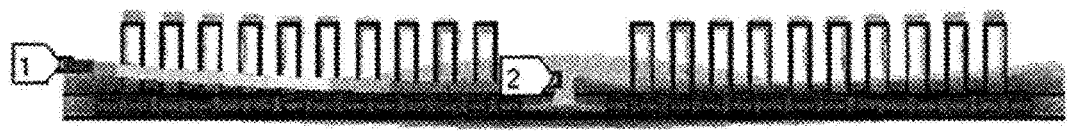

[FIG. 14C]
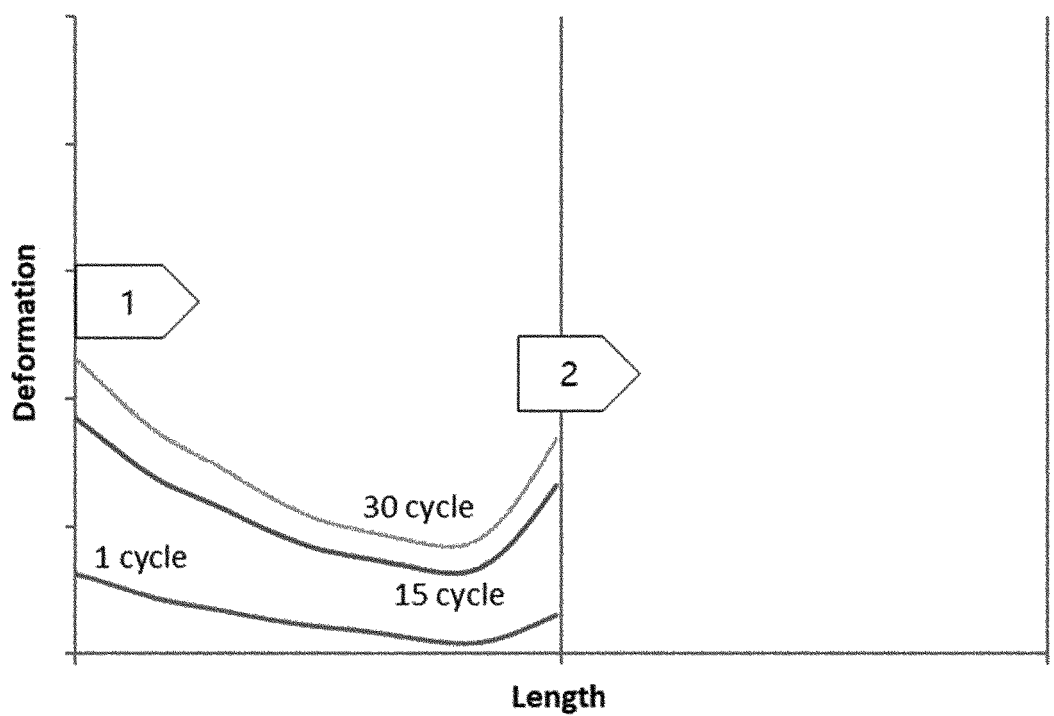

[FIG. 15A]
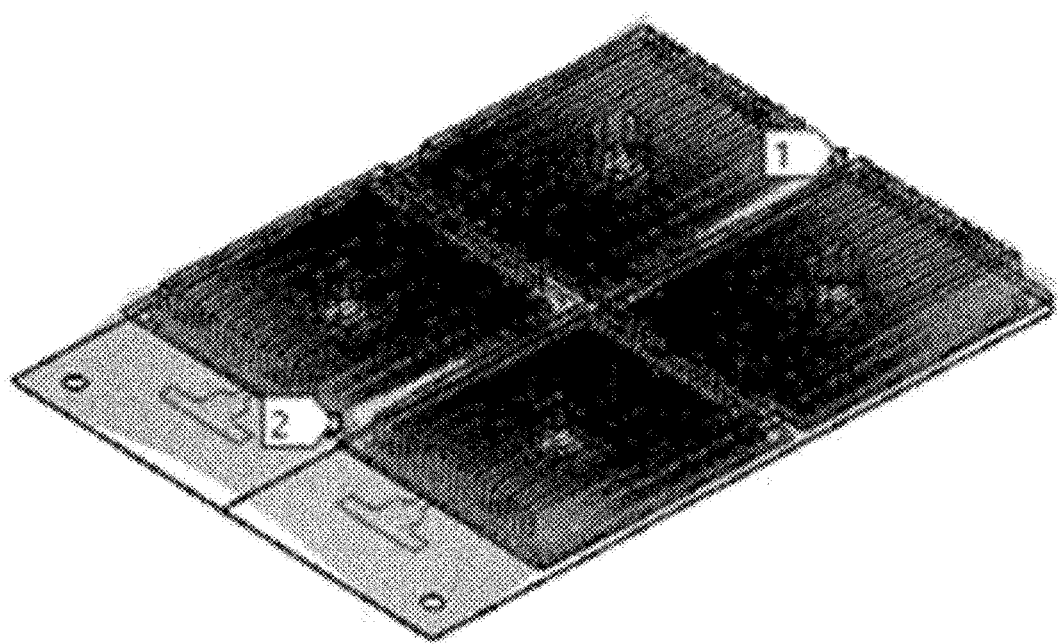
[FIG. 15B]
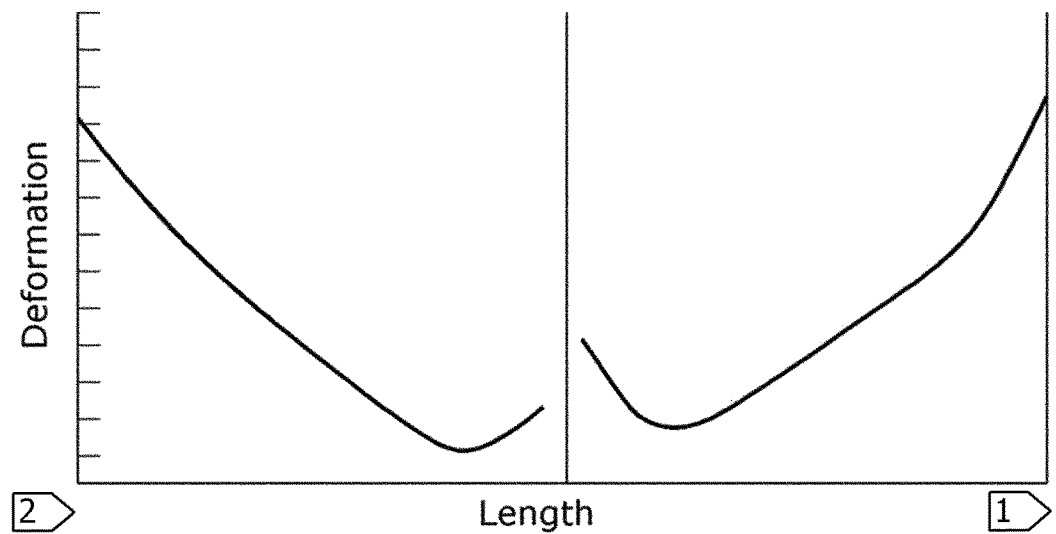

[FIG. 16A]
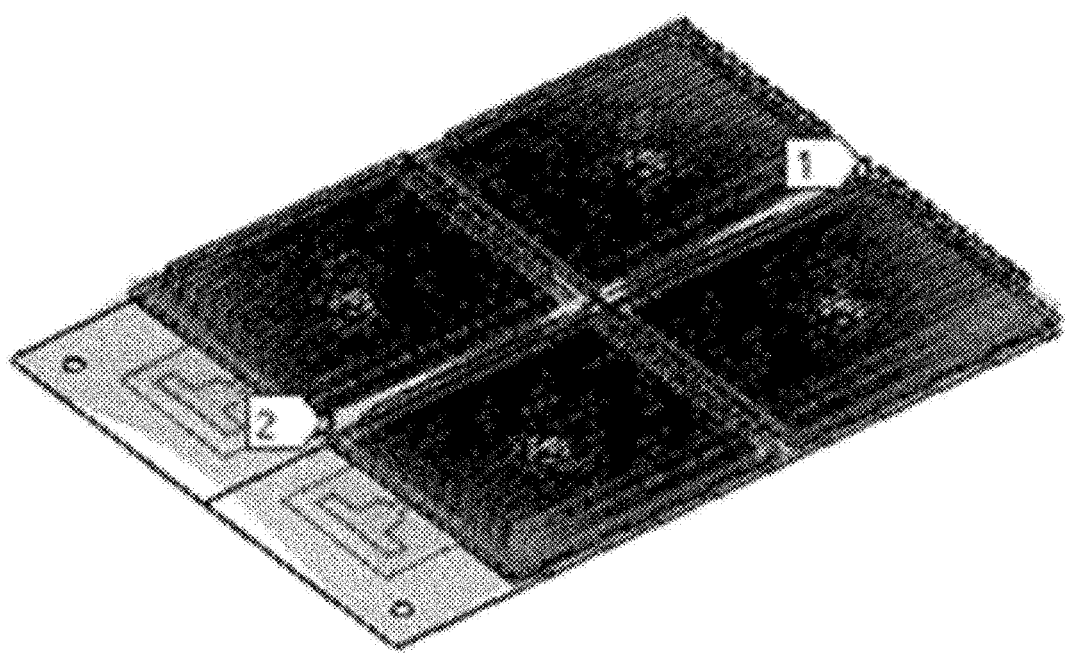
[FIG. 16B]
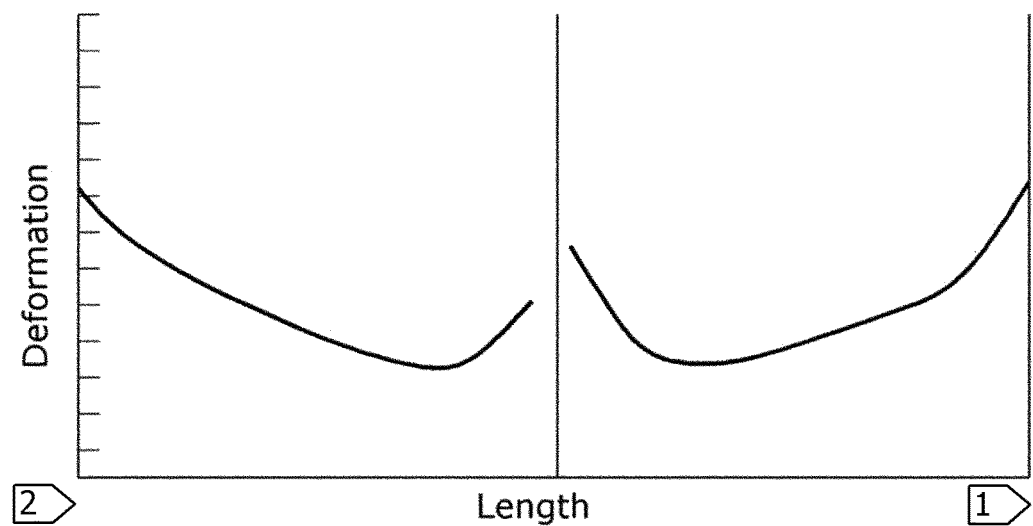

THERMOELECTRIC DEVICE

CROSS-REFERENCE TO RELATED PATENT APPLICATIONS

This application is a U.S. National Stage Application under 35 U.S.C. § 371 of PCT Application No. PCT/KR2021/015039, filed Oct. 25, 2021, which claims priority to Korean Patent Application No. 10-2020-0139322, filed Oct. 26, 2020, whose entire disclosures are hereby incorporated by reference.

TECHNICAL FIELD

The present invention relates to a thermoelectric device.

BACKGROUND ART

A thermoelectric effect is a direct energy conversion phenomenon between heat and electricity that occurs due to movement of electrons and holes in a material.

A thermoelectric device is generally referred to as a device using a thermoelectric effect and has a structure in which P-type thermoelectric materials and N-type thermoelectric materials are disposed between and bonded to metal electrodes to form PN junction pairs.

Thermoelectric devices may be divided into devices using a change in electrical resistance according to a change in temperature, devices using the Seebeck effect in which an electromotive force is generated due to a difference in temperature, devices using the Peltier effect in which heat absorption or heating occurs due to a current, and the like.

Thermoelectric devices have been variously applied to home appliances, electronic components, communication components, and the like. For example, thermoelectric devices may be applied to cooling apparatuses, heating apparatuses, power generation apparatuses, and the like. Therefore, the demand for thermoelectric performance of thermoelectric device is gradually increasing.

A thermoelectric device includes substrates, electrodes, and thermoelectric legs, the plurality of thermoelectric legs are disposed between an upper substrate and a lower substrate in an array form, a plurality of upper electrodes are disposed between the plurality of thermoelectric legs and the upper substrate, and a plurality of lower electrodes are disposed between the plurality of thermoelectric legs and the lower substrate.

A manufacturing process of a thermoelectric device may be performed in a high-temperature environment in order to bond substrates, electrodes, and thermoelectric legs. Accordingly, a substrate warpage phenomenon may occur due to a difference in coefficient of thermal expansion between materials and may degrade long term reliability, durability, and power generation performance of the thermoelectric device.

DISCLOSURE

Technical Problem

The present invention is directed to providing a thermoelectric device of which a substrate warpage phenomenon is reduced.

Technical Solution

One aspect of the present invention provides a thermoelectric device including a substrate, a first insulating layer disposed on the substrate, a second insulating layer disposed on the first insulating layer and having an area smaller than an area of the first insulating layer, a plurality of first electrodes disposed on the second insulating layer, a plurality of semiconductor structures disposed on the plurality of first electrodes, and a plurality of second electrodes disposed on the plurality of semiconductor structures, wherein the second insulating layer includes an overlapping region in which the plurality of first electrodes, the plurality of second electrodes, and the plurality of semiconductor structures overlap vertically and a protruding pattern protruding from the overlapping region toward a first outer side the substrate.

A width of the protruding pattern may be smaller than a width of the overlapping region.

The protruding pattern and the first outer side of the substrate may be spaced apart from each other.

A protruding length of the protruding pattern may be greater than a length from the protruding pattern to the first outer side.

The protruding pattern may include a first protruding pattern and a second protruding pattern which are disposed apart from each other A separation distance between the first protruding pattern and the second protruding pattern may be 0.9 to 2 times each of a distance between a second outer side perpendicular to the first outer side and the first protruding pattern on the substrate and a distance between a third outer side which is perpendicular to the first outer side and faces the second outer side and the second protruding pattern on the substrate.

The thermoelectric device may further include a first terminal electrode and a second terminal electrode which protrude from the plurality of first electrodes toward the first outer side, and each of the first terminal electrode and the second terminal electrode may be disposed on one of the first protruding pattern and the second protruding pattern.

An area of each of the first terminal electrode and the second terminal electrode may be greater than an area of each of the plurality of first electrodes.

The thermoelectric device may further include a sealing member in contact with the first insulating layer at the first outer side and in contact with the second insulating layer at a fourth outer side facing the first outer side.

The second insulating layer may include a first concave part and a second concave part disposed around the first concave part, each of the plurality of first electrodes may be disposed on the first concave part, and a first vertical distance between the first concave part and the substrate may be smaller than a second vertical distance between the second concave part and the substrate.

The first insulating layer may be disposed apart from at least a part of the edge of the first substrate.

The second insulating layer may be disposed apart from at least a part of the edge of the first insulating layer.

A composition of the first insulating layer and a composition of the second insulating layer may be different from each other.

The thermoelectric device may further include an upper substrate disposed on the plurality of second electrodes, and the upper substrate may not vertically overlap the protruding pattern.

The plurality of first electrodes may include a first electrode group and a second electrode group disposed apart from each other, the plurality of second electrodes may include a third electrode group and a fourth electrode group disposed apart from each other, the first electrode group and the third electrode group may overlap in a direction perpendicular to the substrate, and the second electrode group and the fourth electrode group may overlap in the direction perpendicular to the substrate.

The upper substrate may include a first upper substrate disposed on the third electrode group and a second upper substrate spaced apart from the first upper substrate and disposed on the fourth electrode group.

Advantageous Effects

According to embodiments of the present invention, a thermoelectric device, of which a substrate warpage phenomenon is reduced and long term reliability, durability, and power generation performance are high, can be obtained.

Particularly, according to the embodiments of the present invention, the thermoelectric device that not only achieves bonding performance, heat conduction performance, and withstand voltage performance, but also enables a substrate warpage phenomenon to be reduced can be obtained using an insulating layer disposed between a substrate and electrodes and a structure of the substrate.

DESCRIPTION OF DRAWINGS

FIG. 1 is a cross-sectional view illustrating a thermoelectric device.

FIG. 2 is a perspective view illustrating the thermoelectric device.

FIG. 3 is a perspective view illustrating a thermoelectric device including a sealing member.

FIG. 4 is an exploded perspective view illustrating the thermoelectric device including the sealing member.

FIG. 5 is a cross-sectional view illustrating a thermoelectric device according to one embodiment of the present invention.

FIG. 6 is a top view illustrating a substrate, an insulating layer, and electrodes included in a thermoelectric device according to one embodiment of the present invention.

FIG. 7A is an exploded perspective view illustrating a thermoelectric device according to one embodiment of the present invention.

FIG. 7B is a perspective view illustrating the thermoelectric device according to one embodiment of the present invention.

FIG. 8 is a top view illustrating a substrate, an insulating layer, and an electrode included in a thermoelectric device according to another embodiment of the present invention.

FIG. 9 is a perspective view illustrating the thermoelectric device according to another embodiment of the present invention.

FIG. 10 is a perspective view illustrating a thermoelectric device according to still another embodiment of the present invention.

FIG. 11 is a top view illustrating a substrate, an insulating layer, and an electrode included in the thermoelectric device according to still another embodiment of the present invention.

FIGS. 12A and 12B are sets of views illustrating a bonding structure between a heat sink and a second substrate in a thermoelectric module according to one embodiment of the present invention.

FIGS. 13A to 13C are a set of views showing a simulation result when an upper substrate of a thermoelectric device is a single substrate.

FIGS. 14A to 14C are a set of views showing a simulation result when an upper substrate of a thermoelectric device includes divided substrates.

FIGS. 15A and 15B are a set of views showing a simulation result according to a model in which a second insulating layer is entirely applied.

FIGS. 16A and 16B are a set of views showing a simulation result according to a model in which a second insulating layer is applied with a pattern.

MODES OF THE INVENTION

Hereinafter, exemplary embodiments of the present invention will be described in detail with reference to the accompanying drawings.

However, the technical spirit of the present invention is not limited to some embodiments which will be described and may be realized using various other embodiments, and at least one component of the embodiments may be selectively coupled, substituted, and used within the range of the technical spirit.

In addition, unless clearly and specifically defined otherwise by context, all terms (including technical and scientific terms) used herein can be interpreted as having meanings customarily understood by those skilled in the art, and meanings of generally used terms, such as those defined in commonly used dictionaries, will be interpreted by considering contextual meanings of the related technology.

In addition, the terms used in the embodiments of the present invention are considered in a descriptive sense and not for limiting the present invention.

In the present specification, unless specifically indicated otherwise by the context, singular forms include the plural forms thereof, and in a case in which "at least one (or one or more) among A, B, and C" is described, this may include at least one combination among all possible combinations of A, B, and C.

In addition, in descriptions of components of the present invention, terms such as "first," "second," "A," "B," "(a)," and "(b)" can be used.

The terms are only to distinguish one element from another element, and an essence, order, and the like of the element are not limited by the terms.

In addition, when an element is referred to as being "connected" or "coupled" to another element, such a description may include both a case in which the element is directly connected or coupled to another element and a case in which the element is connected or coupled to another element with still another element disposed therebetween.

In addition, in a case in which any one element is described as being formed or disposed "on" or "under" another element, such a description includes both a case in which the two elements are formed or disposed in direct contact with each other and a case in which one or more other elements are formed or disposed between the two elements. In addition, when one element is described as being disposed "on or under" another element, such a description may include a case in which the one element is disposed at an upper side or lower side with respect to another element.

FIG. 1 is a cross-sectional view illustrating a thermoelectric device, and FIG. 2 is a perspective view illustrating the thermoelectric device. FIG. 3 is a perspective view illustrating a thermoelectric device including a sealing member, and FIG. 4 is an exploded perspective view illustrating the thermoelectric device including the sealing member.

Referring to FIGS. 1 to 2, a thermoelectric device 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower surfaces of the P-type thermoelectric legs 130 and the N-type thermoelectric legs 140, and the upper electrodes 150 are disposed between the upper substrate 160 and upper surfaces of the P-type thermoelectric legs 130 and the N-type thermoelectric legs 140. Accordingly, the plurality of P-type thermoelectric legs 130 and the plurality of N-type thermoelectric legs 140 are electrically connected through the lower electrodes 120 and the upper electrodes 150. A pair of the P-type thermoelectric leg 130 and the N-type thermoelectric leg 140 disposed between the lower electrodes 120 and the upper electrode 150 and electrically connected to each other may form a unit cell.

For example, when a voltage is applied to the lower electrodes 120 and the upper electrodes 150 through lead wires 181 and 182, due to the Peltier effect, the substrate, through which a current flows from the P-type thermoelectric leg 130 to the N-type thermoelectric leg 140, may absorb heat to serve as a cooling portion, and the substrate, through which a current flows from the N-type thermoelectric leg 140 to the P-type thermoelectric leg 130, may be heated to serve as a heating portion. Alternatively, when a temperature difference is applied between the lower electrode 120 and the upper electrode 150, due to the Seebeck effect, electric charges may move through the P-type thermoelectric leg 130 and the N-type thermoelectric leg 140 so that electricity may also be generated.

In FIGS. 1 to 4, it is illustrated that the lead wires 181 and 182 are disposed on the lower substrate 110, but the present invention is not limited thereto, and the lead wires 181 and 182 may be disposed on the upper substrate 160, or one of the lead wires 181 and 182 may be disposed on the lower substrate 110 and the other may be disposed on the upper substrate 160.

In this case, each of the P-type thermoelectric leg 130 and the N-type thermoelectric leg 140 may be a bismuth-telluride (Bi—Te)-based thermoelectric leg mainly including Bi and Te. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), Te, Bi, and indium (In). For example, the P-type thermoelectric leg 130 may include Bi—Sb—Te as a main material at 99 to 99.999 wt % and at least one among Ni, Al, Cu, Ag, Pb, B, Ga, and In at 0.001 to 1 wt % based on a total weight of 100 wt %. The N-type thermoelectric leg 140 may be the Bi—Te-based thermoelectric leg including at least one among Se, Ni, Al, Cu, Ag, Pb, B, Ga, Te, Bi, and In. For example, the N-type thermoelectric leg 140 may include Bi—Se—Te as a main material at 99 to 99.999 wt % and at least one among Ni, Al, Cu, Ag, Pb, B, Ga, and In at 0.001 to 1 wt % based on a total weight of 100 wt %. Accordingly, in the present specification, the thermoelectric leg may also be referred to as a semiconductor structure, a semiconductor element, a semiconductor material layer, a conductive semiconductor structure, a thermoelectric structure, a thermoelectric material layer, or the like.

Each of the P-type thermoelectric leg 130 and the N-type thermoelectric leg 140 may be formed in a bulk type or stack type. Generally, the bulk type P-type thermoelectric leg 130 or the bulk type N-type thermoelectric leg 140 may be formed through a process in which a thermoelectric material is heat-treated to manufacture an ingot, the ingot is ground and strained to obtain a powder for a thermoelectric leg, the powder is sintered, and a sintered body is cut. In this case, each of the P-type thermoelectric leg 130 and the N-type thermoelectric leg 140 may be a polycrystalline thermoelectric leg. As described above, when each of the P-type thermoelectric leg 130 and the N-type thermoelectric leg 140 is a polycrystalline thermoelectric leg, the strength of the P-type thermoelectric leg 130 and the N-type thermoelectric leg 140 may increase. The stack type P-type thermoelectric leg 130 or the stack type N-type thermoelectric leg 140 may be formed in a process in which a paste containing a thermoelectric material is applied on base members each having a sheet shape to form unit members, and the unit members are stacked and cut.

In this case, pairs of the P-type thermoelectric legs 130 and the N-type thermoelectric legs 140 may have the same shape and volume or may have different shapes and volumes. For example, since electrical conduction properties of the P-type thermoelectric leg 130 and the N-type thermoelectric leg 140 are different, a height or cross-sectional area of the N-type thermoelectric leg 140 may be different from that of the P-type thermoelectric leg 130.

In this case, the P-type thermoelectric leg 130 or N-type thermoelectric leg 140 may have a cylindrical shape, a polygonal column shape, an elliptical column shape, or the like.

Alternatively, the P-type thermoelectric leg 130 or the N-type thermoelectric leg 140 may also have a stack type structure. For example, the P-type thermoelectric leg or the N-type thermoelectric leg may be formed using a method in which a plurality of structures in which a semiconductor material is applied on base members each having a sheet shape are stacked and cut. Accordingly, material loss can be prevented, and an electrical conduction property may be improved. The structures may further include conductive layers having opening patterns, and accordingly, an adhesive force between the structures may increase, heat conductivity may decrease, and electric conductivity may increase.

Alternatively, the P-type thermoelectric leg 130 or the N-type thermoelectric leg 140 may be formed so that cross-sectional areas are different in one thermoelectric leg. For example, in one thermoelectric leg, cross-sectional areas of both end portions disposed toward the electrodes are greater than a cross-sectional area between both end portions. Accordingly, since a temperature difference between both end portions may be large, thermoelectric efficiency can be improved.

The performance of a thermoelectric device according to one embodiment of the present invention may be expressed as a thermoelectric performance figure of merit (ZT). The thermoelectric performance figure of merit (ZT) may be expressed by Equation 1.

$$ZT = \alpha^2 \cdot \sigma \cdot T/k \qquad \text{[Equation 1]}$$

Here, α denotes the Seebeck coefficient [V/K], σ denotes electric conductivity [S/m], and α2·σ denotes a power factor [W/mK2]. In addition, T denotes temperature, and k denotes thermal conductivity [W/mK]. k may be expressed as a·cp·ρ, wherein a denotes thermal diffusivity [cm2/S], cp denotes specific heat [J/gK], and ρ denotes density [g/cm3].

In order to obtain the thermoelectric performance figure of merit (ZT) of a thermoelectric device, a Z value (V/K) is measured using a Z meter, and thus the thermoelectric performance figure of merit (ZT) may be calculated using the measured Z value.

In this case, each of the lower electrodes 120 disposed between the lower substrate 110 and the P-type thermoelectric legs 130 and N-type thermoelectric legs 140 and the upper electrodes 150 disposed between the upper substrate 160 and the P-type thermoelectric legs 130 and N-type thermoelectric legs 140 may include at least one among Cu, Ag, Al, and Ni and may have a thickness of 0.01 mm to 0.3 mm. When the thickness of the lower electrode 120 or the upper electrode 150 is less than 0.01 mm, an electrode function thereof is degraded, and thus the electric conductivity performance can be lowered, and when the thickness thereof is greater than 0.3 mm, resistance thereof increases, and thus conduction efficiency can be lowered.

In addition, the lower substrate 110 and the upper substrate 160, which are opposite to each other, may be metal substrates, and a thickness of each of the lower substrate 110 and the upper substrate 160 may be in the range of 0.1 mm to 1.5 mm. When the thickness of the metal substrate is less than 0.1 mm or greater than 1.5 mm, since a heat radiation property or heat conductivity may become excessively high, reliability of the thermoelectric device may be degraded. In addition, when the lower substrate 110 and the upper substrate 160 are the metal substrates, insulating layers 170 may be further formed between the lower substrate 110 and the lower electrodes 120 and between the upper substrate 160 and the upper electrodes 150. The insulating layer 170 may include a material having a heat conductivity of 1 to 20 W/K.

In this case, sizes of the lower substrate 110 and the upper substrate 160 may also be different. For example, a volume, thickness, or area of one of the lower substrate 110 and the upper substrate 160 may be greater than that of the other. Accordingly, the heat absorption or radiation performance of the thermoelectric device can be improved. For example, at least one of a volume, a thickness, and an area of one substrate, which is disposed in a hot-temperature area for the Seebeck effect or is applied as a heating area for the Peltier effect, or on which a sealing member for protecting the thermoelectric module from an external environment is disposed, may be greater than at least one of a volume, a thickness, and an area of the other substrate.

In addition, a heat radiation pattern, for example, a concave-convex pattern, may be formed on a surface of at least one of the lower substrate 110 and the upper substrate 160. Accordingly, the heat radiation performance of the thermoelectric device may be improved. When the concave-convex pattern is formed on the surface in contact with the P-type thermoelectric leg 130 or the N-type thermoelectric leg 140, a bonding property between the thermoelectric leg and the substrate can be improved. The thermoelectric device 100 includes the lower substrate 110, the lower electrodes 120, the P-type thermoelectric legs 130, the N-type thermoelectric legs 140, the upper electrodes 150, and the upper substrate 160.

As illustrated in FIGS. 3 and 4, a sealing member 190 may be further disposed between the lower substrate 110 and the upper substrate 160. The sealing member 190 may be disposed on side surfaces of lower electrodes 120, P-type thermoelectric legs 130, N-type thermoelectric legs 140, and upper electrodes 150 between the lower substrate 110 and the upper substrate 160. Accordingly, the lower electrodes 120, the P-type thermoelectric legs 130, the N-type thermoelectric legs 140, and the upper electrodes 150 may be sealed from external moisture, heat, and contamination. In this case, the sealing member 190 may include a sealing case 192 disposed predetermined distances apart from surfaces of an outermost side of the plurality of lower electrodes 120, an outermost side of the plurality of P-type thermoelectric legs 130 and the plurality of N-type thermoelectric legs 140, and outermost surfaces of the plurality of upper electrodes 150, a sealing member 194 disposed between the sealing case 192 and the lower substrate 110, and a sealing member 196 disposed between the sealing case 192 and the upper substrate 160. As described above, the sealing case 192 may be in contact with the lower substrate 110 and the upper substrate 160 through the sealing members 194 and 196. Accordingly, a problem in which heat conduction occurs through the sealing case 192 and thus a temperature difference between the lower substrate 110 and the upper substrate 160 decreases when the sealing case 192 is in direct contact with the lower substrate 110 and the upper substrate 160 can be prevented. In this case, each of the sealing members 194 and 196 may include at least one of an epoxy resin and a silicone resin or tape of which both surfaces are coated with at least one of an epoxy resin and a silicone resin. The sealing members 194 and 194 may serve to airtightly seal a gap between the sealing case 192 and the lower substrate 110 and a gap between the sealing case 192 and the upper substrate 160, can improve a sealing effect of the lower electrodes 120, the P-type thermoelectric legs 130, the N-type thermoelectric legs 140, and the upper electrodes 150, and may be interchangeably used with a finishing material, a finishing layer, a waterproofing member, a waterproofing layer, and the like. In this case, the sealing member 194, which seals the gap between the sealing case 192 and the lower substrate 110, may be disposed on an upper surface of the lower substrate 110, and the sealing member 196, which seals the gap between the sealing case 192 and the upper substrate 160, may be disposed on a side surface of the upper substrate 160. Meanwhile, guide grooves G for withdrawing lead wires 180 and 182 connected to the electrodes may be formed in the sealing case 192. To this end, the sealing case 192 may be an injection molding part formed of plastic or the like and may be interchangeably used with a sealing cover. However, the above description about the sealing member is only exemplary, and the sealing member may be changed in any of various forms. Although not illustrated in the drawings, an insulator may be further included to surround the sealing member. Alternatively, the sealing member may further include an insulating component.

As described above, although terms such as "lower substrate 110," "lower electrode 120," "upper electrode 150," and "upper substrate 160" have been used, the terms "upper" and "lower" are arbitrarily used only for the sake of ease of understanding and convenience of description, and positions thereof may also be reversed so that the lower substrate 110 and the lower electrode 120 are disposed in upper portions, and the upper electrode 150 and the upper substrate 160 are disposed in lower portions.

Meanwhile, as described above, efforts to use metal substrates in order to increase the thermal conductivity performance of thermoelectric devices have been increasing. However, when a thermoelectric device includes a metal substrate, an advantageous effect can be obtained in terms of thermal conductivity, but there is a problem of lowering a withstand voltage. Particularly, when the thermoelectric device is applied to a high-voltage environment, the withstand voltage performance of 2.5 kV or more is required. A plurality of insulating layers having different compositions may be disposed between the metal substrate and the electrode in order to improve the withstand voltage performance of the thermoelectric device.

FIG. 5 is a cross-sectional view illustrating a thermoelectric device according to one embodiment of the present invention. Repeated descriptions of content which is the same as the content described with reference to FIGS. 1 to 4 will be omitted.

Referring to FIG. 5, a thermoelectric device 300 according to the embodiment of the present invention includes a first substrate 310, a first insulating layer 320 disposed on the first substrate 310, a second insulating layer 324 disposed on the first insulating layer 320, a plurality of first electrodes 330 disposed on the second insulating layer 324, a plurality of P-type thermoelectric legs 340 and a plurality of N-type thermoelectric legs 350 disposed on the plurality of first electrodes 330, a plurality of second electrodes 360 disposed on the plurality of P-type thermoelectric legs 340 and the plurality of N-type thermoelectric legs 350, a third insulating layer 370 disposed on the plurality of second electrodes 360, and a second substrate 380 disposed on the third insulating layer 370. Descriptions of the first substrate 310, the first electrodes 330, the P-type thermoelectric legs 340, the N-type thermoelectric legs 350, the second electrodes 360, and the second substrate 380 are the same as the descriptions of the first substrate 110, the first electrodes 120, the P-type thermoelectric legs 130, the N-type thermoelectric legs 140, the second electrodes 150, and the second substrate 160 of FIGS. 1 to 4.

Although not illustrated in FIG. 5, a heat sink may be further disposed on the first substrate 310 or the second substrate 380, and a sealing member may be further disposed between the first substrate 310 and the second substrate 380.

According to the embodiment of the present invention, the first insulating layer 320 and the second insulating layer 324 are disposed on the first substrate 310, and the first electrodes 330 are disposed on the second insulating layer 324.

In this case, the first insulating layer 320 may include, for example, a resin material and may include a composite containing silicon and aluminum and an inorganic filler material. In this case, the composite may be an organic and inorganic composite formed of an inorganic material containing the element Si and the element Al and alkyl chains, and may be at least one among oxides, carbides, and nitrides which contain silicon and aluminum. For example, the composite may have at least one among Al—Si bonding, Al—O—Si bonding, Si—O bonding, Al—Si—O bonding, and Al—O bonding. The composite having at least one among the Al—Si bonding, the Al—O—Si bonding, the Si—O bonding, the Al—Si—O bonding, and the Al—O bonding as described above may have high insulation performance, and thus high withstand voltage performance may be achieved. Alternatively, the composite may be oxides, carbides, or nitrides which further include titanium, zirconium, boron, zinc, or the like in addition to silicon and aluminum. To this end, the composite may be formed in a process in which at least one of an inorganic binder and a mixed organic and inorganic binder are mixed with aluminum and thermally treated. The inorganic binder may include, for example, at least one of silica (SiO2), a metal alkoxide, boron oxide (B2O3), and zinc oxide (ZnO2). The inorganic binder is inorganic particles and may be a sol or gel when in contact with water to serve as a binder. In this case, at least one of the silica (SiO2), the metal alkoxide, and the boron oxide (B2O3) may serve to improve adhesiveness with the aluminum or the first substrate 310, and the zinc oxide (ZnO2) may serve to improve a strength and thermal conductivity of the first insulating layer 320. The inorganic filler material may disperse in the composite and include at least one of aluminum oxide and nitrides. In this case, the nitrides may include at least one of boron nitrides and aluminum nitrides.

Meanwhile, the second insulating layer 324 may be formed as a resin layer including at least one of an epoxy resin composite including an epoxy resin and an inorganic filler material and a silicone resin composite including polydimethylsiloxane (PDMS). Accordingly, the second insulating layer 324 can improve the performance of insulation, adhesiveness, and thermal conductivity between the first insulating layer 320 and the first electrodes 330.

In this case, the inorganic filler material may be included at 60 to 80 wt % of the resin layer. When the inorganic filler material is included at less than 60 wt %, an effect of thermal conductivity may be lowered, and when the inorganic filler material is included at more than 80 wt %, it is difficult for the inorganic filler material to be uniformly dispersed in a resin, and the resin layer may be easily broken.

In addition, the epoxy resin may include an epoxy compound and a curing agent. In this case, the curing agent may be included therein at a volume ratio of 1 to 10 with respected to a volume ratio of 10 of the epoxy compound. In this case, the epoxy compound may include at least one of a crystalline epoxy compound, a non-crystalline epoxy compound, and a silicone epoxy compound. The inorganic filler material may include at least one of aluminum oxides and nitrides. In this case, the nitrides may include at least one of boron nitrides and aluminum nitrides.

Meanwhile, the second insulating layer 324 may be formed in a process in which a resin composite in an uncured or semi-cured state is applied on the first insulating layer 320 and the plurality of first electrodes 330 arranged in advance are disposed, pressed, and cured. Accordingly, a part of a side surface of the plurality of first electrodes 330 may be buried in the second insulating layer 324. In this case, a height H1 of the side surface of the plurality of first electrodes 330 buried in the second insulating layer 324 may be 0.1 to 1 times, preferably 0.2 to 0.9 times, and more preferably 0.3 to 0.8 times a thickness H of the plurality of first electrodes 330. As described above, when the part of the side surface of the plurality of first electrodes 330 is buried in the second insulating layer 324, a contact area between the plurality of first electrodes 330 and the second insulating layer 324 increases, and thus thermal conduction performance and bonding strength between the plurality of first electrodes 330 and the second insulating layer 324 may be improved further. When the height H1 of the side surface of the plurality of first electrodes 330 buried in the second insulating layer 324 is less than 0.1 times the thickness H of the plurality of first electrodes 330, it may be difficult to achieve sufficient thermal conduction performance and bonding strength between the plurality of first electrodes 330 and the second insulating layer 324, and when the height H1 of the side surface of the plurality of first electrodes 330 buried in the second insulating layer 324 is greater than 1 times the thickness H of the plurality of first electrodes 330, the second insulating layer 324 may extend over the plurality of first electrodes 330, and thus the plurality of first electrodes 330 may be electrically short-circuited.

As described above, the second insulating layer 324 may include first concave parts R1 and second concave parts R2 disposed around the first concave parts R1. The plurality of first electrodes 330 may be disposed on the first concave parts R1, and first vertical distances between the first concave parts R1 and the first substrate 310 may be smaller than second vertical distances between the second concave parts R2 and the first substrate 310. More specifically, a thickness of the second insulating layer 324 between the plurality of first electrodes 330 decreases toward central regions from side surfaces of the electrodes, and a vertex may have a smooth "V" shape. Accordingly, there is a difference in thickness of the insulating layers 320 and 324 between the plurality of first electrodes 330, and a height T2 of the insulating layers 320 and 324 is highest in regions in which the insulating layers 320 and 324 are in direct contact with the side surfaces of the plurality of first electrodes 330, and a height T3 thereof in the central regions may be smaller than the height T2 in the regions in which the insulating layers 320 and 324 are in direct contact with the side surfaces of the plurality of first electrodes 330. That is, the height T3 of the central regions of the insulating layers 320 and 324 between the plurality of first electrodes 330 may be smallest in the insulating layers 320 and 324 between the plurality of first electrodes 330. In addition, a height T1 of the insulating layers 320 and 324 under the plurality of first electrodes 330 may be smaller than the height T3 of the central regions of the insulating layers 320 and 324 between the plurality of first electrodes 330. Since the second insulating layer 324 includes the second concave parts R2, stress applied to the insulating layer may be reduced, and thus a problem of cracking, peeling, or the like of the insulating layer can be reduced.

Meanwhile, a composition of the first insulating layer 320 and a composition of the second insulating layer 324 may be different from each other, accordingly, at least one of a hardness, an elasticity modulus, a tensile strength, an elongation, and a Young's modulus of the first insulating layer 320 may be different from that of the second insulating layer 324, and thus withstand voltage performance, thermal conductivity performance, bonding performance, and thermal shock reduction performance can be controlled. For example, a weight ratio of the composite and the inorganic filler material to the entirety of the first insulating layer 320 may be higher than a weight ratio of the inorganic filler material to the entirety of the second insulating layer 324. As described above, the composite may be a composite including silicon and aluminum, and more specifically, may be a composite including at least one of oxides, carbides, and nitrides including silicon and aluminum. For example, a weight ratio of a ceramic, that is, the composite and the inorganic filler material, to the entirety of the first insulating layer 320 may be greater than 80 wt %, and a weight ratio of a ceramic, that is, the inorganic filler material, to the entirety of the second insulating layer 324 may be 60 to 80 wt %. As described above, when a content of the composite and the inorganic filler material included in the first insulating layer 320 is higher than a content of the inorganic filler material included in the second insulating layer 324, the hardness of the first insulating layer 320 may be higher than the hardness of the second insulating layer 324. Accordingly, the first insulating layer 320 may have high withstand voltage performance and high thermal conductivity performance at the same time, the second insulating layer 324 may have higher elasticity than the first insulating layer 320, and the second insulating layer 324 can improve bonding performance between the first insulating layer 320 and the first electrodes 330. In this case, the elasticity may be referred to as a tensile strength. For example, a tensile strength of the second insulating layer 324 may be in the range of 2 to 5 MPa, preferably 2.5 to 4.5 MPa, and more preferably 3 to 4 MPa, and a tensile strength of the first insulating layer 320 may be in the range of 10 MPa to 100 MPa, more preferably 15 MPa to 90 MPa, and more preferably 20 MPa to 80 MPa.

In this case, a thickness of the second insulating layer 324 may be greater than one times and 3.5 times or less, more preferably 1.05 or more times and two times or less, and more preferably 1.1 times or more to 1.5 times or less a thickness of the first insulating layer 320. For example, the thickness of the first insulating layer 320 may be 35 μm or less, and the thickness of the second insulating layer 324 may be greater than 35 μm and 80 μm or less, preferably greater than 35 μm and 70 μm or less, and more preferably greater than 35 μm and 50 μm or less.

When the thickness of the first insulating layer 320 and the thickness of the second insulating layer 324 satisfy these value ranges, all of withstand voltage performance, thermal conductivity performance, bonding performance, and thermal shock reduction performance can be achieved. In addition, a height of a concave upper surface of the second concave part R2 may be greater than a vertical height between a bottom surface of the electrode 330 and an upper surface of the substrate and may be lower than a vertical height between the upper surface of the electrode 330 and the upper surface of the substrate. Through this structure, the electrode 330 can be stably buried, and stress applied to the insulating layer can be effectively reduced.

In addition, a width of the first concave part R1 may be greater than a width of the second concave part R2. Accordingly, since a structure in which the electrodes are densely disposed on the substrate is possible, the power generation performance or temperature control performance of the thermoelectric element can be improved.

However, the first insulating layer 320 and the second insulating layer 324 may have different coefficients of thermal expansion. Accordingly, when the thermoelectric device 300 is exposed to a high-temperature for a long time, a phenomenon in which the thermoelectric device 300 is warped due to stress may occur and the long term reliability and durability of the thermoelectric device are degraded, and when the thermoelectric device is applied to a power generation apparatus, the power generation performance of the power generation apparatus may be reduced.

One purpose of the embodiment of the present invention is to reduce a substrate warpage phenomenon using a layout of the second insulating layer 324 having a relatively higher coefficient of thermal expansion (CTE) than the first insulating layer 320.

FIG. 6 is a top view illustrating a substrate, an insulating layer, and electrodes included in a thermoelectric device according to one embodiment of the present invention, FIG. 7A is an exploded perspective view illustrating the thermoelectric device according to one embodiment of the present invention, and FIG. 7B is a perspective view illustrating the thermoelectric device according to one embodiment of the present invention.

Referring to FIGS. 6 to 7, a thermoelectric device 300 according to the embodiment of the present invention includes a first substrate 310, a first insulating layer 320 disposed on the first substrate 310, a second insulating layer 324 disposed on the first insulating layer 320, a plurality of first electrodes 330 disposed on the second insulating layer 324, a plurality of P-type thermoelectric legs 340 and a plurality of N-type thermoelectric legs 350 disposed on the plurality of first electrodes 330, a plurality of second electrodes 360 disposed on the plurality of P-type thermoelectric legs 340 and the plurality of N-type thermoelectric legs 350, a third insulating layer 370 disposed on the plurality of second electrodes 360, and a second substrate 380 disposed on the third insulating layer 370. A heat sink 390 may be further disposed on the second substrate 380.

Repeated descriptions of content which is the same as the content described with reference to FIGS. 1 to 5 will be omitted.

When a voltage is applied to the thermoelectric device 300, the first substrate 310 may absorb heat according to the Peltier effect and function as a low-temperature part, and the second substrate 380 may radiate heat and function as a high-temperature part. Alternatively, when different temperatures are applied to the first substrate 310 and the second substrate 380, while electrons in a high-temperature region move to a low-temperature region due to a temperature difference, thermoelectric power is generated. This is called the Seebeck effect, and electricity may be generated in a circuit of the thermoelectric device due to the thermoelectric power.

A plurality of first through holes 311 may be formed in the first substrate 310. Similarly, a plurality of second through holes (not shown) may be formed in the second substrate 380, and the plurality of first through holes 311 may be disposed at positions corresponding to the plurality of second through holes. Accordingly, a plurality of bonding members (not shown) may pass through the plurality of first through holes 311 and the plurality of second through holes, and the first substrate 310 and the second substrate 380 may be fixed by the plurality of bonding members (not shown).

Generally, a CTE of a copper substrate is about $18*10^{-6}$/mK, a CTE of the thermoelectric legs is about $17.5*10^{-6}$/mK, a CTE of each of the first insulating layer 320 and the second insulating layer 324 may be greater than the CTE of each of the copper substrate and the thermoelectric legs, and the CTE of the second insulating layer 324 may be greater than the CTE of the first insulating layer 320. For example, in order to satisfy both the bonding performance of the second insulating layer 324 and the withstand voltage performance of the first insulating layer 320, the CTE of the second insulating layer 324 may also be greater than two times the CTE of the first insulating layer 320.

One purpose of the embodiment of the present invention is to minimize a substrate warpage phenomenon by arranging the second insulating layer 324 only on a part of the first insulating layer 320.

As illustrated in FIG. 6, an area of the second insulating layer 324 may be smaller than an area of the first insulating layer 320. That is, the second insulating layer 324 may be disposed on only the part of the first insulating layer 320 instead of an entire surface thereof. Accordingly, a warpage phenomenon of the first substrate 310 due to a difference in CTE between the first insulating layer 320 and the second insulating layer 324 can be reduced, and thermal stress can be reduced. Accordingly, a problem in which the first electrode 330 or the thermoelectric legs 340 and 350 are separated or electrically opened can be prevented, a thermal conduction effect can be improved, and ultimately an amount of power generation or cooling features of the thermoelectric device can be improved.

More specifically, referring to FIGS. 6 to 7, the second insulating layer 324 may include a region P1 in which the plurality of first electrodes 330, a plurality of semiconductor structures 340 and 350, and the plurality of second electrodes 360 overlap vertically. Hereinafter, a vertical direction in the present specification may be a direction (Z direction) from the first substrate 310 toward the second substrate 380.

In addition, the second insulating layer 324 may further include protruding patterns P2 and P3 protruding from the region P1, in which the plurality of first electrodes 330, the plurality of semiconductor structures 340 and 350, and the plurality of second electrodes 360 overlap vertically, toward a first outer side S1 of the first substrate 310. In this case, the first outer side S1 may be one of first to fourth outer sides S1 to S4 constituting an edge of the first substrate 310 and may be disposed in a direction in which a plurality of terminal electrodes T1 and T2 protrude from the plurality of first electrodes 330. Accordingly, a distance between the overlapping region P1 of the first insulating layer 324 and the first outer side S1 of the first substrate 310 is greater than a distance between the overlapping region P1 of the first insulating layer 324 and each of the remaining outer sides (for example, outer sides S2 to S4) of the first substrate 310. In the present specification, the terminal electrodes T1 and T2 are electrodes for connecting electric wires and may be disposed coplanar with the plurality of first electrodes 330 on the second insulating layer 324. An area of each of the terminal electrodes T1 and T2 may be greater than an area of each of the plurality of first electrodes 330, and accordingly, connectors C1 and C2 for connection of the electric wires may be disposed on the terminal electrodes T1 and T2. When the terminal electrodes T1 and T2 protrude from the plurality of first electrodes 330 toward the first outer side S1, a distance thereof in a direction from the first outer side S1 toward the fourth outer side S4 of the first substrate 310, that is, a distance thereof in a Y direction, may be greater than a distance thereof in a direction from the second outer side S2 toward the third outer side S3 of the first substrate 310, that is, a distance thereof in an X direction.

In this case, a region in which the connectors C1 and C2 are disposed on the terminal electrodes T1 and T2 may not overlap the plurality of semiconductor structures 340 and 350, the plurality of second electrodes 360, the third insulating layer 370, the second substrate 380, and the heat sink 390 in the vertical direction (for example, in the Z direction of FIG. 7). Accordingly, it is easy to connect lead wires to the connectors C1 and C2.

As described above, when the region in which the connectors C1 and C2 are disposed on the terminal electrodes T1 and T2 does not overlap the second substrate 380 and the heat sink 390 in the vertical direction, the first outer side S1 may also not overlap the second substrate 380 and the heat sink 390 in the vertical direction. That is, as illustrated in FIGS. 6 and 7, at least a part of the second outer side S2 perpendicular to the first outer side S1 and at least a part of the third outer side S3 perpendicular thereto overlap the second substrate 380 and the heat sink 390 in the vertical direction, but the entirety of the first outer side S1 may not overlap the second substrate 380 or the heat sink 390 in the vertical direction.

According to the embodiment of the present invention, the protruding patterns P2 and P3 may include a first protruding pattern P2 and a second protruding pattern P3 which are disposed apart from each other, a first terminal electrode T1 may be disposed on the first protruding pattern P2, and a second terminal electrode T2 may be disposed on the second protruding pattern P3. Accordingly, since the second insulating layer 324 may not be disposed on a part of the first substrate 310, a problem in which the first substrate 310 is warped due to the second insulating layer 324 having a high CTE can be minimized.

More specifically, according to the embodiment of the present invention, a width (a width W1 and a width W2) of the protruding patterns P2 and P3 may be smaller than a width W of the region P1 in which the plurality of first electrodes 330, the plurality of semiconductor structures 340 and 350, and the plurality of second electrodes 360 overlap vertically, and the protruding patterns P2 and P3 may be spaced apart from the first outer side S1 of the first substrate 310. In the present specification, a width may be defined as a distance in the X direction, and a length may be defined as a distance in the Y direction. Accordingly, since the second insulating layer 324 is not disposed in a part between the region P1, in which the plurality of first electrodes 330, the plurality of semiconductor structures 340 and 350, and the plurality of second electrodes 360 overlap vertically, and the first outer side S1 of the first substrate 310, warpage of the first substrate 310 in the Y direction can be reduced.

In this case, a separation distance d1 between the first protruding pattern P2 and the second protruding pattern P3 may be 0.9 to 2 times, preferably 0.95 to 1.5 times, and more preferably 0.97 to 1.2 times each of a distance d2 between the second outer side S2 of the first substrate 310 and the first protruding pattern P2 and a distance d3 of the third outer side S3 of the first substrate 310 and the second protruding pattern P3. Accordingly, a region in which the second insulating layer 324 is not disposed between the third outer side S3 and the second outer side S2 of the first substrate 310 and a region in which the second insulating layer 324 is not disposed between the first protruding pattern P2 and the second protruding pattern P3 serve to buffer against thermal expansion of the protruding patterns P2 and P3 of the second insulating layer 324, warpage of the first substrate 310 in the X direction can be reduced, and the warpage of the first substrate 310 in the X direction may be symmetrical with respect to a center of the first substrate 310 in the X direction.

Meanwhile, as described above, the protruding patterns P2 and P3 may be spaced apart from the first outer side S1 of the first substrate 310. Accordingly, since a region in which the second insulating layer 324 is not disposed between the protruding patterns P2 and P3 and the first outer side S1 of the first substrate 310 serves to buffer against the thermal expansion of the protruding patterns P2 and P3 of the second insulating layer 324, the warpage of the first substrate 310 in a Y-axis direction can be reduced.

In this case, a sealing member (not shown) may be disposed at the first outer side S1 to be in contact with the first insulating layer 320 and at the fourth outer side S4 to be in contact with the second insulating layer 324. That is, since the second insulating layer 324 is not disposed at the first outer side S1 of the first substrate 310, due to the terminal electrodes T1 and T2, even when a length of the first substrate 310 in the Y-axis direction increases, the warpage of the first substrate 310 in the Y-axis direction can be reduced. In this case, a protruding length D1 of the protruding patterns P2 and P3 may be greater than a length D2 from the protruding patterns P2 and P3 to the first outer side S1 of the first substrate 310. Accordingly, since the length of the first substrate 310 in the Y direction is not longer than necessary, the warpage of the first substrate 310 in the Y direction can be reduced.

Meanwhile, according to the embodiment of the present invention, the first insulating layer 320 may be disposed apart from at least a part of an edge of the first substrate 310, that is, the first to fourth outer sides S1 to S4 of the first substrate 310. When the first insulating layer 320 is disposed apart from at least the part of the edge of the first substrate 310, since the edge of the first substrate 310 may serve to buffer against thermal expansion of the first insulating layer 320, warpage of the first substrate 310 can be reduced. In addition, as an example, the CTE of the first insulating layer 320 may be different from and greater than the CTE of the first substrate 310.

Similarly, the second insulating layer 324 may be disposed apart from at least a part of an edge of the first insulating layer 320. When the second insulating layer 324 is disposed apart from at least the part of the edge of the first insulating layer 320, since the edge of the first insulating layer 320 may serve to buffer against thermal expansion of the second insulating layer 324, the warpage of the first substrate 310 can be reduced. In addition, as an example, the CTE of the second insulating layer 324 may be greater than the CTE of the first insulating layer 320.

Meanwhile, referring to FIG. 7, the second substrate 380 may be disposed on the plurality of second electrodes 360, and in this case, the second substrate 380 may not vertically overlap the protruding patterns P2 and P3 of the second insulating layer 324. Since the terminal electrodes T1 and T2 are disposed on the protruding patterns P2 and P3 of the second insulating layer 324, and the connectors C1 and C2 for connection of the electric wires are disposed on the terminal electrodes T1 and T2, when the second substrate 380 does not vertically overlap the protruding patterns P2 and P3 of the second insulating layer 324, it is easy to connect the electric wires through the connectors.

Referring to FIG. 6, the second concave part R2 of the second insulating layer 324 may be disposed around the first electrode 330. The first electrodes 330 may have a shape of which a length in an X-axis direction and a length in the Y-axis direction are different from each other. Accordingly, the second concave parts R2 of the second insulating layer 324 may also have a plurality of shapes in which lengths in the X-axis direction are different from each other or lengths in the Y-axis direction are different from each other. In a region in which the plurality of first electrodes 330 and the plurality of second electrodes 360 overlap vertically, the second concave parts R2 of the second insulating layer 324 may be positioned between the electrodes, and instead of the concave parts, flat parts may be positioned in the protruding patterns P2 and P3 of the second insulating layer 324. Accordingly, stress applied from the first substrate 310 to the second insulating layer 324 can be reduced in the X-axis direction and the Y-axis direction to prevent a substrate warpage phenomenon and prevent crack or delamination phenomena of the first insulating layer 320 and second insulating layer 324. However, the present invention is not limited thereto, since a distance between the terminal electrode T1 and the electrode 330 is greater than distances between the plurality of first electrodes 330, the second concave part R2 of the second insulating layer 324 may be formed as the flat parts in the protruding patterns P2 and P2 of the second insulating layer 324, and a concave part having a larger width in the X-axis direction and a larger length in the Y-axis than the second concave part R2 of the second insulating layer 324 disposed between the plurality of first electrodes 330 may also be disposed. Since the second concave parts R2 of the second insulating layer 324 may have different widths in the region P1 in which the plurality of first electrodes 330 and the plurality of second electrodes 360 overlap vertically and in the protruding patterns P2 and P3, an effect of suppressing warpage of the substrate can be achieved, and crack or delamination of the second insulating layer 324 can be effectively prevented.

In the above-described embodiment, a configuration in which the first insulating layer 320 and the second insulating layer 324 are separately disposed has been disclosed, but the present invention is not limited thereto, and the first insulating layer 320 and the second insulating layer 324 may be disposed as a single layer. Even when the first insulating layer 320 and the second insulating layer 324 are disposed as the single layer, a resin material including an inorganic filler material may be applied to secure thermal conductivity and withstand voltage features described above, but the present invention is not limited thereto. In addition, even when the first insulating layer 320 and the second insulating layer 324 are disposed as the single layer, a pattern of the second insulating layer 324 may be used without change.

Meanwhile, according to the embodiment of the present invention, in order to reduce warpage of the substrate, at least one of the first substrate 310 and the second substrate 380 may also be formed as a plurality of divided substrates.

FIG. 8 is a top view illustrating a substrate, an insulating layer, and electrodes included in a thermoelectric device according to another embodiment of the present invention, and FIG. 9 is a perspective view illustrating the thermoelectric device according to another embodiment of the present invention. FIG. 10 is a perspective view illustrating a thermoelectric device according to still another embodiment of the present invention, and FIG. 11 is a top view illustrating a substrate, an insulating layer, and electrodes included in the thermoelectric device according to still another embodiment of the present invention.

Referring to FIGS. 8 to 11, a thermoelectric device 300 according to the embodiment of the present invention includes a first substrate 310, a first insulating layer 320 disposed on the first substrate 310, a second insulating layer 324 disposed on the first insulating layer 320, a plurality of first electrodes 330 disposed on the second insulating layer 324, a plurality of P-type thermoelectric legs 340 and a plurality of N-type thermoelectric legs 350 disposed on the plurality of first electrodes 330, a plurality of second electrodes 360 disposed on the plurality of P-type thermoelectric legs 340 and the plurality of N-type thermoelectric legs 350, a third insulating layer 370 disposed on the plurality of second electrodes 360, and second substrates 380 disposed on the third insulating layer 370. Heat sinks 390 may be further disposed on the second substrates 380.

Repeated descriptions of content which is the same as the content described with reference to FIGS. 1 to 7 will be omitted.

According to the embodiment of the present invention, the second substrates 380 may include a plurality of second substrates 381, 382, 383, and 384 which are disposed apart from each other, and through holes through which bonding members (not shown) pass may be formed in the first substrate 310 and the second substrates 381, 382, 383, and 384 included in the second substrates 380.

A plurality of first through holes 311 may be formed in the first substrate 310. In addition, second through holes may be formed in the plurality of second substrates 381, 382, 383, and 384, and the plurality of first through holes 311 may be disposed at positions corresponding to the second through holes. Accordingly, the plurality of bonding members (not shown) may pass through the plurality of first through holes 311 and second through holes, and the first substrate 310 and the plurality of second substrates 381, 382, 383, and 384 may be fixed by the plurality of bonding members (not shown).

Meanwhile, when heat sinks 391, 392, 393, and 394 are disposed on the second substrates 381, 382, 383, and 384, third through holes may be formed in the heat sinks 391, 392, 393, and 394, and the plurality of first through holes 311 may be disposed at positions corresponding to the second through holes and the third through holes. Accordingly, the plurality of bonding members (not shown) may pass through the plurality of first through holes 311, the second through holes, and the third through holes, and the first substrate 310, the second substrates 380, and the heat sinks 390 may be fixed by the plurality of bonding members.

Meanwhile, as illustrated in FIGS. 8 to 10, when the second substrates 380 are divided into the plurality of second substrates 381, 382, 383, and 384, even when the second substrates 380 are frequently exposed to high temperatures, a problem in which the second substrates 380 are thermally deformed by thermal expansion can be prevented, and the present invention is easily applied in large area applications.

According to the embodiment of the present invention, as illustrated in FIG. 10, an insulator 1000 may also be disposed in a separation region between the plurality of second substrates 381, 382, 383, and 384. Accordingly, the insulator 1000 may be disposed between and coupled to the plurality of second substrates 381, 382, 383, and 384, and accordingly, the separation region between the plurality of second substrates 381, 382, 383, and 384 may be sealed.

Meanwhile, when the second substrates 380 include the plurality of second substrates 381, 382, 383, and 384 disposed apart from each other, the plurality of first electrodes 330 disposed on the first substrate 310 may be disposed to correspond to the plurality of second substrates 381, 382, 383, and 384.

That is, as illustrated in FIG. 8, the plurality of first electrodes 330 may include a plurality of electrode groups disposed apart from each other, the second electrodes 360 may include a plurality of electrode groups disposed apart from each other, and the electrode groups of the first electrodes 330 may overlap the electrode groups of the second electrodes 360 in a direction from the first substrate 310 toward the second substrate 380.

More specifically, referring to FIG. 8, the first electrodes 330 may include a plurality of electrode groups 331, 332, 333, and 334 disposed apart from each other, and the electrode groups 331, 332, 333, and 334 may include a plurality of electrodes 330E disposed apart from each other. Although not illustrated in FIG. 8, the second electrodes 360 may include a plurality of electrode groups overlapping the plurality of electrode groups 331, 332, 333, and 334 in a direction perpendicular to the first substrate 310.

Each of a first terminal electrode T1 and a second terminal electrode T2 may protrude from one of the plurality of electrode groups 331, 332, 333, and 334. Connectors (not shown) may be disposed on the first terminal electrode T1 and the second terminal electrode T2, and the first terminal electrode T1 and the second terminal electrode T2 may be connected to an external power source through the connectors (not shown). Meanwhile, the first electrodes 330 may further include connection electrode parts 330C connecting at least some of the plurality of electrode groups 331, 332, 333, and 334. The connection electrode parts 330C may include, for example, at least one among a first connection electrode 330C1 disposed between a first-1 electrode group 331 and a second-1 electrode group 332, a second connection electrode 330C2 disposed between the first-1 electrode group 331 and a first-2 electrode group 333, a third connection electrode 330C3 disposed between the first-2 electrode group 333 and a second-2 electrode group 334, and a fourth connection electrode connecting the second-1 electrode group 332 and a second-2 electrode group 334. The plurality of electrode groups 331, 332, 333, and 334 may be directly or indirectly connected to other electrode groups through the connection electrode parts 330C, and electric paths may be formed using the first terminal electrode T1 and second terminal electrode T2.

The electrode groups 331, 332, 333, and 334 may be disposed without being disposed in hole arrangement regions 310H. Although not illustrated in the drawing, the second electrodes 360 may also be disposed without being disposed in hole arrangement regions corresponding to the hole arrangement regions 310H. In this case, the hole arrangement regions 310H may be regions formed by virtual lines connecting edges, which are disposed most adjacent to holes 311, of the electrodes 330E disposed most adjacent to holes 311. An area of the hole arrangement region may be four or more times, preferably six or more times, and more preferably eight or more times an area of the electrode 330E. Accordingly, since a predetermined separation distance between the hole 311 and the first electrodes 330 may be maintained, a separation distance between a coupling member (not shown) passing through the hole 311 and the first electrodes 330 may be maintained, and thus, the withstand voltage performance of the thermoelectric module 300 of AC 1 kV or more may be maintained.

In this case, a separation region between the plurality of electrode groups 331, 332, 333, and 334 may correspond to the separation region between the plurality of second substrates 381, 382, 383, and 384, and separation distances between the plurality of electrode groups 331, 332, 333, and 334 may be greater than separation distances between the plurality of electrodes 330E in the electrode groups 331, 332, 333, and 334.

For example, when the first electrodes 330 include the first-1 electrode group 331, the second-1 electrode group 332 disposed apart from the first-1 electrode group 331 in a first direction, the first-2 electrode group 333 disposed apart from the first-1 electrode group 331 in a second direction perpendicular to the first direction, and the second-2 electrode group 334 disposed apart from the first-2 electrode group 333 in the first direction and from the second-2 electrode group 332 in the second direction, the first-1 electrode group 331 and the first-2 electrode group 333 may be spaced apart from the second-1 electrode group 332 and the second-2 electrode group 334 in the first direction, and the first-1 electrode group 331 and the second-1 electrode group 332 may be spaced apart from the first-2 electrode group 333 and the second-2 electrode group 334 in the second direction.

Meanwhile, referring to FIG. 11, dummy parts 900 may be disposed on side surfaces of the plurality of electrode groups 331, 332, 333, and 334 in parts of the separation region between the plurality of electrode groups 331, 332, 333, and 334. As described above, when the dummy parts 900 are disposed, since stress may be uniformly applied to the entirety of the first substrate 310, a warpage phenomenon in a "W" shape can be reduced.

For example, a first dummy part 910 may be disposed between the first-1 electrode group 331 and the second-1 electrode group 332. In addition, a second dummy part 920 may be disposed between the first-2 electrode group 333 and the second-2 electrode group 334. In addition, a third dummy part 930 may be disposed between the first-1 electrode group 331 and second-1 electrode group 332 and the first-2 electrode group 333 and second-2 electrode group 334. In this case, the first dummy part 910 and the second dummy part 920 may be spaced apart from each other by the third dummy part 930. Alternatively, the first connection electrode 330C1 disposed between the first electrode group 331 and the second electrode group 332 may be disposed between the first dummy part 910 and the third dummy part 930, and the third connection electrode 330C3 disposed between the first-2 electrode group 333 and the second-2 electrode group 334 may be disposed between the second dummy part 920 and the third dummy part 930.

Accordingly, when the first substrate 310 is exposed to a high temperature, since stress is uniformly applied to the entirety of the first substrate 310, a warpage phenomenon of the first substrate 310 in a "W" shape can be minimized.

In this case, at least one of the first dummy part 910, the second dummy part 920, and the third dummy part 930 may include a plurality of dummy structures having shapes and sizes which are the same as shapes and sizes of the electrodes 330E included in the electrode groups and are disposed apart from each other.

Accordingly, when the first substrate 310 is exposed to a high temperature, since stress is uniformly applied to the entirety of the first substrate 310, a warpage phenomenon of the first substrate 310 in a "W" shape can be minimized, and it is easy to design and arrange the dummy parts for a manufacturing process.

In this case, the dummy structures may be metal layers. For example, the metal layers may have the same materials, shapes, and sizes as the electrodes 330E, but the thermoelectric legs are not disposed on the metal layers, and the metal layers may not be electrically connected to the other electrodes 330E. Accordingly, it is easy to design and arrange the dummy parts 900 for the manufacturing process.

Alternatively, the dummy structures may also be resin layers. For example, each of the resin layers may include at least one of an epoxy resin and a polyimide resin. Since the resin layers have thermal resistance performance, the resin layers can prevent thermal conduction between the electrode groups and improve thermal conduction efficiency between the electrodes and the first substrate in the electrode groups. In addition, since the resin layers have insulation performance, the resin layers can improve the withstand voltage performance of the first substrate 310.

In this case, an area of the second insulating layer 324 may be smaller than an area of the first insulating layer 320. That is, the second insulating layer 324 may include a region P1 in which the plurality of first electrodes 330, a plurality of semiconductor structures 340 and 350, and the plurality of second electrodes 360 overlap vertically and protruding patterns P2 and P3 protruding toward a first outer side S1 of the first substrate 310. Terminal electrodes T1 and T2 may be disposed on the protruding patterns P2 and P3, and the protruding patterns P2 and P2 may be disposed not to overlap the second substrates 381, 382, 383, and 384 vertically.

In addition, since the detailed content related to the first substrate 310, the first insulating layer 320, and the second insulating layer 324 is the same as that described with reference to FIGS. 5 to 7, repeated description will be omitted for the sake of convenience in the description.

Accordingly, since substrate warpage of not only the first substrate 310 but also the second substrate 380 can be prevented, warpage of the entirety of the thermoelectric device 300 can be minimized.

FIG. 12 is a set of views illustrating a bonding structure between a heat sink and a second substrate in a thermoelectric module according to one embodiment of the present invention.

Referring to FIG. 12, a thermoelectric device 300 may be coupled by a plurality of bonding members 400. For example, when a heat sink 390 is disposed on a second substrate 380, the plurality of bonding members 400 may couple the heat sink 390 and the second substrate 380, couple the heat sink 390, the second substrate 380, and a first substrate (not shown), couple the heat sink 390, the second substrate 380, the first substrate (not shown), and a cooling part (not shown), couple the second substrate 380, the first substrate (not shown), and the cooling part (not shown), or couple the second substrate 380 and the first substrate (not shown). Alternatively, the first substrate (not shown) and the cooling part (not shown) may be connected through other coupling members at an outer side of an effective region on the first substrate (not shown).

To this end, through holes S through which the bonding members 400 pass may be formed in the heat sink 390, the second substrate 380, the first substrate (not shown), and the cooling part (not shown). In this case, separate insulation insertion members 410 may be further disposed between the through holes S and the bonding members 400. The separate insulation insertion members 410 may be insulation insertion members surrounding outer circumferential surfaces of the bonding members 400 or insulation insertion members surrounding wall surfaces of the through holes S. Accordingly, an insulation distance of the thermoelectric device can be increased.

Meanwhile, a shape of the insulation insertion member 410 may be the same as a shape illustrated in FIGS. 12A and 12B.

Referring to FIG. 12A, a diameter d2' of the through hole S of a first surface in contact with a second electrode of a second substrate 280 may be the same as a diameter of a through hole of a first surface in contact with a first electrode of a first substrate. In this case, according to the shape of the insulation insertion member 410, the diameter d2' of the through hole S formed in the first surface of the second substrate 380 may be different from a diameter d2 of the through hole S formed in a second surface which is an opposite surface of the first surface. Although not illustrated in the drawing, when a step is not formed in a region of the through hole S, and the insulation insertion member 410 is disposed only on a part of an upper surface of the second substrate 380, or the insulation insertion member 410 is disposed to extend from the upper surface of the second substrate 380 to a part or the entirety of the wall surface of the through hole S, the diameter d2' of the through hole S formed in the first surface of the second substrate 380 may be the same as the diameter d2 of the through hole S formed in the second surface which is the opposite surface of the first surface.

Referring to FIG. 12B, according to a shape of an insulation insertion member 410, a diameter d2' of a through hole S formed in a first surface in contact with a second electrode of a second substrate 380 may be greater than a diameter of a through hole of a first surface in contact with a first electrode of a first substrate. In this case, the diameter d2' of the through hole S of the first surface of the second substrate 380 may be 1.1 to 2.0 times the diameter of the through hole of the first surface of the first substrate. When the diameter d2' of the through hole S of the first surface of the second substrate 380 is less than 1.1 times the diameter of the through hole of the first surface of the first substrate, since an insulation effect of the insulation insertion member 410 is little, dielectric breakdown of the thermoelectric device may occur, and when the diameter d2' of the through hole S of the first surface of the second substrate 380 is greater than 2.0 times the diameter of the through hole of the first surface of the first substrate, since a size of a region occupied by the through hole S relatively increases, an effective area of the second substrate 380 decreases, and thus efficiency of the thermoelectric device may decrease.

In addition, due to the shape of the insulation insertion member 410, the diameter d2' of the through hole S formed in the first surface of the second substrate 380 may be different from a diameter d2 of the through hole S formed in a second surface which is an opposite surface of the first surface. As described above, when a step is not formed in a region of the through hole S of the second substrate 380, the diameter d2' of the through hole S formed in the first surface of the second substrate 380 may be the same as the diameter d2 of the through hole S formed in the second surface which is the opposite surface of the first surface.

Hereinafter, simulation results of warpage reducing effects of the thermoelectric device according to embodiments will be described.

FIG. 13 is a set of views showing a simulation result when an upper substrate of a thermoelectric device is a single substrate, and FIG. 14 is a set of views showing a simulation result when an upper substrate of a thermoelectric device includes divided substrates. In simulations, a CTE of a substrate is set to $18*10\text{-}6/\text{mK}$, a CTE of a thermoelectric leg is set to $17.5*10\text{-}6/\text{mK}$, a CTE of a first insulating layer is set to less than or equal to $30*10\text{-}6/\text{mK}$, and a CTE of a second insulating layer is set to $92*10\text{-}6/\text{mK}$. An upper substrate according to a model of FIG. 13A is formed as a single substrate illustrated in FIG. 7, and an upper substrate according to a model of FIG. 14A is formed as divided substrates illustrated in FIG. 9. Warpage of a substrate is measured after a total of 30 cycles are performed, wherein one cycle is performed by fixing a temperature at a side of a lower substrate to 35° C., lowering a temperature of a side of an upper substrate from 200° C. to 50° C., and raising the temperature of the side of the upper substrate to 200° C. again. FIGS. 13B and 14B are views illustrating cross sections in a direction (hereinafter, short axis direction) perpendicular to a direction in which terminal electrodes of FIGS. 13A and 14B protrude after 30 cycles are performed for each simulation. FIGS. 13C and 14C are graphs showing deformation between a point 1 and a point 2 in each of FIGS. 13B and 14B according to the number of cycles. Scales of the graphs in FIGS. 13C and 14C are the same.

Referring to FIGS. 13A to 13C and FIGS. 14A to 14C, when the upper substrate is formed as the divided substrates, it can be seen that warpage of the substrate in the short axis direction is significantly reduced. That is, it can be seen that a ratio of a gap (see FIG. 14A) between the point 1 and the point 2 when the upper substrate includes the divided substrates to a gap (see FIG. 13A) between the point 1 and the point 2 when the upper substrate is the single substrate is reduced to about 54%.

FIG. 15 shows a simulation result according to a model in which a second insulating layer is applied on an entire surface, and FIG. 16 shows a simulation result according to a model in which a second insulating layer is applied with a pattern. In simulations, a CTE of a substrate is set to $18*10\text{-}6/\text{mK}$, a CTE of a thermoelectric leg is set to $17.5*10\text{-}6/\text{mK}$, a CTE of a first insulating layer is set to less than or equal to $30*10\text{-}6/\text{mK}$, and a CTE of a second insulating layer is set to $92*10\text{-}6/\text{mK}$. An upper substrate is formed as divided substrates as illustrated in FIG. 9. In the model of FIG. 15, the second insulating layer is applied on an entire surface of a first insulating layer, and in the model of FIG. 16, the second insulating layer is applied on a part of the first insulating layer to have protruding patterns as illustrated in FIGS. 6 and 8.

Warpage of a substrate is measured after a total of 30 cycles are performed, wherein one cycle is performed by fixing a temperature at a side of a lower substrate to 35° C., lowering a temperature of a side of an upper substrate from 200° C. to 50° C., and raising the temperature of the side of the upper substrate to 200° C. again. FIGS. 15B and 16B are graphs showing deformation between a point 1 and a point 2 in a direction (hereinafter, in a long axis direction) in which terminal electrodes of FIGS. 15A and 15A protrude after 30 cycles are performed in each simulation. Scales of the graphs in FIGS. 15B and 16B are the same.

Referring to FIGS. 15 and 16, it can be seen that, in the model of FIG. 16, a gap between the point 1 and the point 2, that is, warpage in the long axis direction, is significantly low when compared to the model of FIG. 16. That is, a ratio of a gap (see FIG. 16B) between the point 1 and the point 2 in the model in which the second insulating layer is applied as the pattern to a gap (see FIG. 15B) between the point 1 and the point 2 in the model in which the second insulating layer is applied on the entire surface can be reduced to about 53%.

As described above in the embodiment of the present invention, it can be seen that a substrate warpage phenomenon can be reduced when a second insulating layer is patterned. In addition, it can be seen that a substrate warpage phenomenon can be reduced when one of a first substrate and a second substrate is formed as divided substrates. When a warped shape and a warped width of the substrate are improved, a reaction force occurring between electrodes and thermoelectric legs in a thermoelectric device can be reduced, a coupling force between the thermoelectric device and a cooling part can be increased, and the thermoelectric device with long term high reliability, high durability, and high power generation performance can be obtained.

Although not illustrated in the drawings, when a thermoelectric device according to the embodiment of the present invention is applied to a power generation apparatus using the Seebeck effect, the thermoelectric device may be coupled to a first fluid flow part and a second fluid flow part. The first fluid flow part may be disposed on one of a first substrate and a second substrate of the thermoelectric device, and the second fluid flow part may be disposed on the other of the first substrate and the second substrate of the thermoelectric device. In at least one of the first fluid flow part and the second fluid flow part, a flow path may be formed so that at least one of a first fluid and a second fluid flows therethrough. In some cases, at least one of the first fluid flow part and the second fluid flow part may also be omitted, and at least one of the first fluid and the second fluid may also directly flow to the substrate of the thermoelectric device. For example, the first fluid may flow adjacent to one of the first substrate and the second substrate, and the second fluid may flow adjacent to the other thereof. In this case, a temperature of the second fluid may be higher than a temperature of the first fluid. Accordingly, the first fluid flow part may be referred to as a cooling part. As another embodiment, a temperature of a first fluid may be higher than a temperature of a second fluid. Accordingly, the second fluid flow part may be referred to as a cooling part. A heat sink 390 may be connected to a substrate at a side at which a fluid with a higher temperature flows among a first fluid flow part and a second fluid flow part. An absolute value of a difference in temperature between the first fluid and the second fluid may be 40° C. or more, preferably 70° C. or more, and more preferably in the range of 95° C. to 185° C.

When the thermoelectric element or thermoelectric module according to the embodiment of the present invention is used in a transportation apparatus such as a ship or vehicle, electric power may be generated using waste heat discharged from an exhaust side of an engine, and the generated energy may be stored in a battery of the transportation apparatus or the like and supplied to various devices, for example, lights and gas circulation devices in the transportation apparatus. When the thermoelectric element according to the embodiment of the present invention is disposed at an intake side of the engine, the thermoelectric element according to the embodiment of the present invention may be used as not only a power generation apparatus but also a temperature control apparatus. When the thermoelectric element according to the embodiment of the present invention is used as the temperature control apparatus, the fuel efficiency of the engine can be improved by lowering a temperature of gas injected into the engine to increase an amount of gas injected into the engine. Accordingly, the engine in the transportation apparatus and the thermoelectric element according to the embodiment of the present invention may affect each other, and functional unity or technical interoperability therebetween can be achieved. In addition, in the marine transportation business and the transportation industry using the transportation apparatus to which the thermoelectric element according to the embodiment of the present invention is applied, a transportation cost can be reduced and an eco-friendly industrial environment can be achieved due to the thermoelectric element according to the embodiment of the present invention, and thus functional unity or technical interoperability with the thermoelectric element according to the embodiment of the present invention can be achieved.

When the thermoelectric element according to the embodiment of the present invention is used in an electric power plant, heat generated in the electric power plant may be used to control efficiency of used fuel with respect to generated energy, and accordingly, by adjusting an energy production cost and an eco-friendly industrial environment, functional unity or technical interoperability between the thermoelectric element according to the embodiment of the present invention and the electric power plant can be achieved.

When the thermoelectric element according to the embodiment of the present invention is used in a plant such as a steel mill, energy consumed in the plant can be reduced by producing energy through electricity generation using waste heat generated in the plant, and when the thermoelectric element according to the embodiment of the present invention is used as a temperature control apparatus, since the thermoelectric element affects other devices of the plant by adjusting a temperature in a product manufacturing process or in the plant, functional unity or technical interoperability can be achieved between the thermoelectric element according to the embodiment of the present invention and the other devices of the plant.

The thermoelectric element according to the embodiment of the present invention may be used as a temperature sensor of a wireless network or a small power supply apparatus for supplying energy to a sensor. That is, since the energy can be permanently supplied to the sensor or the like, when the thermoelectric element is used as a temperature sensor or power supply apparatus of a temperature sensor installed underground, functional unity or technical interoperability with the wireless network can be achieved.

The thermoelectric element according to the embodiment of the present invention may be used in a temperature control apparatus, and when the thermoelectric element according to the embodiment of the present invention is used in an electric vehicle, battery charging device, or the like, functional unity or technical interoperability can be achieved through a function of improving the stability of the electric vehicle or the battery charging device by adjusting a temperature of the electric vehicle or the battery charging device.

While the present invention has been described with reference to exemplary embodiments thereof, it will be understood by those skilled in the art that various changes and modifications may be made without departing from the spirit and scope of the invention defined by the appended claims below.

The invention claimed is:

1. A thermoelectric device comprising:
a substrate;
a first insulating layer disposed on the substrate;
a second insulating layer disposed on the first insulating layer and having an area smaller than an area of the first insulating layer;
a plurality of first electrodes disposed on the second insulating layer;
a first terminal electrode and a second terminal electrode disposed on the second insulating layer and protruding from the plurality of first electrodes toward a first outer side which is one of a plurality of outer sides constituting an edge of the substrate,
a plurality of semiconductor structures disposed on the plurality of first electrodes; and
a plurality of second electrodes disposed on the plurality of semiconductor structures,
wherein the second insulating layer includes an overlapping region in which the plurality of first electrodes, the plurality of second electrodes, and the plurality of semiconductor structures overlap vertically, a first protruding pattern protruding from the overlapping region toward the first outer side in a first direction, and a second protruding pattern protruding from the overlapping region toward the first outer side in the first direction,
wherein the first protruding pattern and the second protruding pattern are disposed apart from each other in a second direction which is different from the first direction,
wherein the second insulating layer is not disposed between the first protruding pattern and the second protruding pattern,
wherein the first terminal electrode is disposed on the first protruding pattern and the second terminal electrode is disposed on the second protruding pattern,
wherein the area of the first insulating layer and the area of the second insulating layer are areas in planes perpendicular to a direction from the substrate toward the plurality of first electrodes,
wherein the second insulating layer is in direct contact with the first insulating layer,
wherein the first insulating layer is disposed apart from an edge of the substrate,
wherein the second insulating layer is disposed apart from an edge of the first insulating layer,
wherein a CTE (coefficient of thermal expansion) of the first insulating layer is greater than a CTE of the substrate, and
wherein a CTE of the second insulating layer is greater than the CTE of the first insulating layer.

2. The thermoelectric device of claim 1, wherein a width of the first protruding pattern is smaller than a width of the overlapping region.

3. The thermoelectric device of claim 2, wherein the first protruding pattern and the first outer side of the substrate are spaced apart from each other.

4. The thermoelectric device of claim 3, wherein a protruding length of the first protruding pattern is greater than a length from the first protruding pattern to the first outer side.

5. The thermoelectric device of claim 1, wherein a separation distance between the first protruding pattern and the second protruding pattern is 0.9 to 2 times each of a distance between a second outer side perpendicular to the first outer side and the first protruding pattern on the substrate and a distance between a third outer side which is perpendicular to the first outer side and faces the second outer side and the second protruding pattern on the substrate.

6. The thermoelectric device of claim 1, wherein an area of each of the first terminal electrode and the second terminal electrode is greater than an area of each of the plurality of first electrodes.

7. The thermoelectric device of claim 1, further comprising a sealing member in contact with the first insulating layer at the first outer side and in contact with the second insulating layer at a fourth outer side facing the first outer side.

8. The thermoelectric device of claim 1, wherein:
the second insulating layer includes a first concave part and a second concave part disposed around the first concave part;
each of the plurality of first electrodes is disposed on the first concave part; and
a first vertical distance between the first concave part and the substrate is smaller than a second vertical distance between the second concave part and the substrate.

9. The thermoelectric device of claim 1, wherein a composition of the first insulating layer and a composition of the second insulating layer are different from each other.

10. The thermoelectric device of claim 1, further comprising an upper substrate disposed on the plurality of second electrodes,
wherein the upper substrate does not vertically overlap the first protruding pattern and the second protruding pattern.

11. The thermoelectric device of claim 10, wherein:
the plurality of first electrodes includes a first electrode group and a second electrode group disposed apart from each other,
the plurality of second electrodes includes a third electrode group and a fourth electrode group disposed apart from each other,
the first electrode group and the third electrode group overlap in a direction perpendicular to the substrate, and
the second electrode group and the fourth electrode group overlap in the direction perpendicular to the substrate.

12. The thermoelectric device of claim 11, wherein the upper substrate includes a first upper substrate disposed on the third electrode group and a second upper substrate spaced apart from the first upper substrate and disposed on the fourth electrode group.

* * * * *